US010630923B2

(12) United States Patent
Tashiro

(10) Patent No.: US 10,630,923 B2
(45) Date of Patent: Apr. 21, 2020

(54) PHOTOELECTRIC CONVERSION APPARATUS AND IMAGING SYSTEM

(71) Applicant: CANON KABUSHIKI KAISHA, Tokyo (JP)

(72) Inventor: Kazuaki Tashiro, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/976,399

(22) Filed: May 10, 2018

(65) Prior Publication Data

US 2018/0338099 A1 Nov. 22, 2018

(30) Foreign Application Priority Data

May 17, 2017 (JP) .................................. 2017-098194

(51) Int. Cl.
*H04N 5/361* (2011.01)
*H01L 27/146* (2006.01)
(Continued)

(52) U.S. Cl.
CPC ........... *H04N 5/361* (2013.01); *G05D 1/0246* (2013.01); *H01L 27/14609* (2013.01);
(Continued)

(58) Field of Classification Search
CPC .. H04N 5/361; H04N 5/374; H01L 27/14641; H01L 27/14609
See application file for complete search history.

(56) References Cited

U.S. PATENT DOCUMENTS 5,159,422 A  10/1992 Tashiro et al.
5,366,921 A  11/1994 Tashiro
(Continued)

FOREIGN PATENT DOCUMENTS

JP  H02-94565 A  4/1990
JP  2012-164892 A  8/2012
(Continued)

OTHER PUBLICATIONS

U.S. Appl. No. 15/892,889, filed Feb. 9, 2018. Applicant: Tomoya Sasago, et al.

*Primary Examiner* — Nam D Pham
(74) *Attorney, Agent, or Firm* — Venable LLP

(57) ABSTRACT

A photoelectric conversion apparatus and an imaging system with reduced dark current noise while suppressed pixel size are provided. Each pixel has a photoelectric conversion unit and a diode. The photoelectric conversion unit has a first electrode layer, a second electrode layer between the first electrode layer and a semiconductor substrate, and a photoelectric conversion layer between the first electrode layer and the second electrode layer. A diode has a first impurity diffused portion of a first conductivity type and a second impurity diffused portion of a second conductivity type. The second electrode layer is connected to the first impurity diffused portion. The controlling unit applies a voltage to set the first impurity diffused portion and the second impurity diffused portion into a forwardly biased state and a voltage to set the first impurity diffused portion and the second impurity diffused portion into a reversely biased state to the diode.

21 Claims, 20 Drawing Sheets

(51) Int. Cl.
  *G05D 1/02*     (2020.01)
  *H04N 5/3745*   (2011.01)
  *H04N 5/378*    (2011.01)
  *H04N 5/374*    (2011.01)
  *H01L 29/866*   (2006.01)

(52) U.S. Cl.
  CPC ....... *H01L 27/14641* (2013.01); *H04N 5/374* (2013.01); *H04N 5/378* (2013.01); *H04N 5/3745* (2013.01); *H01L 29/866* (2013.01)

(56) References Cited

U.S. PATENT DOCUMENTS

| | | | |
|---|---|---|---|
| 6,069,393 A | 5/2000 | Hatanaka et al. | |
| 6,717,151 B2 | 4/2004 | Tashiro et al. | |
| 6,800,836 B2 | 10/2004 | Hamamoto et al. | |
| 7,129,458 B2 | 10/2006 | Hamamoto et al. | |
| 9,025,059 B2 | 5/2015 | Tashiro | |
| 9,261,769 B2 | 2/2016 | Tashiro et al. | |
| 9,438,836 B2 | 9/2016 | Tashiro et al. | |
| 9,455,289 B2 | 9/2016 | Tashiro | |
| 9,774,810 B2 | 9/2017 | Tashiro et al. | |
| 9,807,331 B2 | 10/2017 | Tashiro | |
| 9,866,774 B2 | 1/2018 | Tashiro | |
| 9,941,315 B2 | 4/2018 | Tashiro | |
| 9,961,284 B2 | 5/2018 | Koga | |
| 9,978,792 B2 | 5/2018 | Tashiro | |
| 2005/0162355 A1* | 7/2005 | Yamazaki | G09G 3/3241 345/76 |
| 2008/0315263 A1* | 12/2008 | Rhodehouse | H01L 27/14609 257/233 |
| 2012/0200752 A1 | 8/2012 | Matsunaga | |
| 2014/0043510 A1* | 2/2014 | Kasuga | H01L 27/14643 348/300 |
| 2016/0295140 A1 | 10/2016 | Moriyama et al. | |
| 2017/0019618 A1 | 1/2017 | Koga | |
| 2018/0013972 A1 | 1/2018 | Tashiro | |
| 2018/0151760 A1 | 5/2018 | Tashiro | |

FOREIGN PATENT DOCUMENTS

| | | |
|---|---|---|
| JP | 2015-177323 A | 10/2015 |
| WO | 2011-058684 A1 | 5/2011 |

* cited by examiner

FIG.9A
FIG.9B
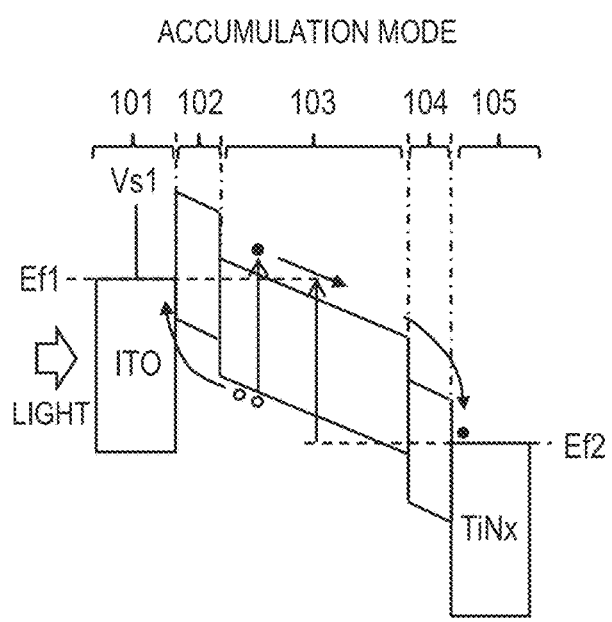
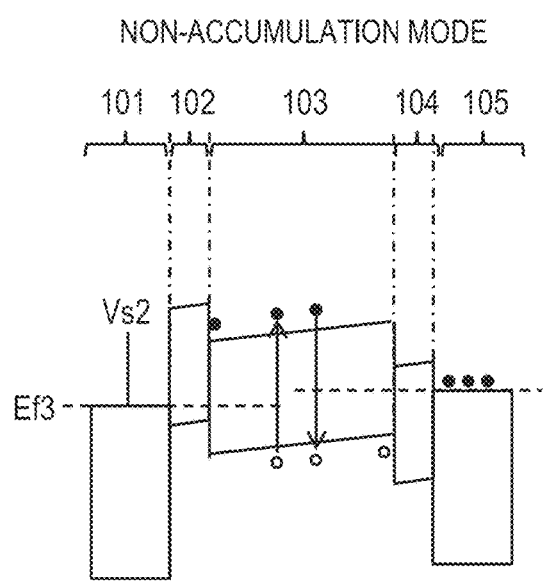

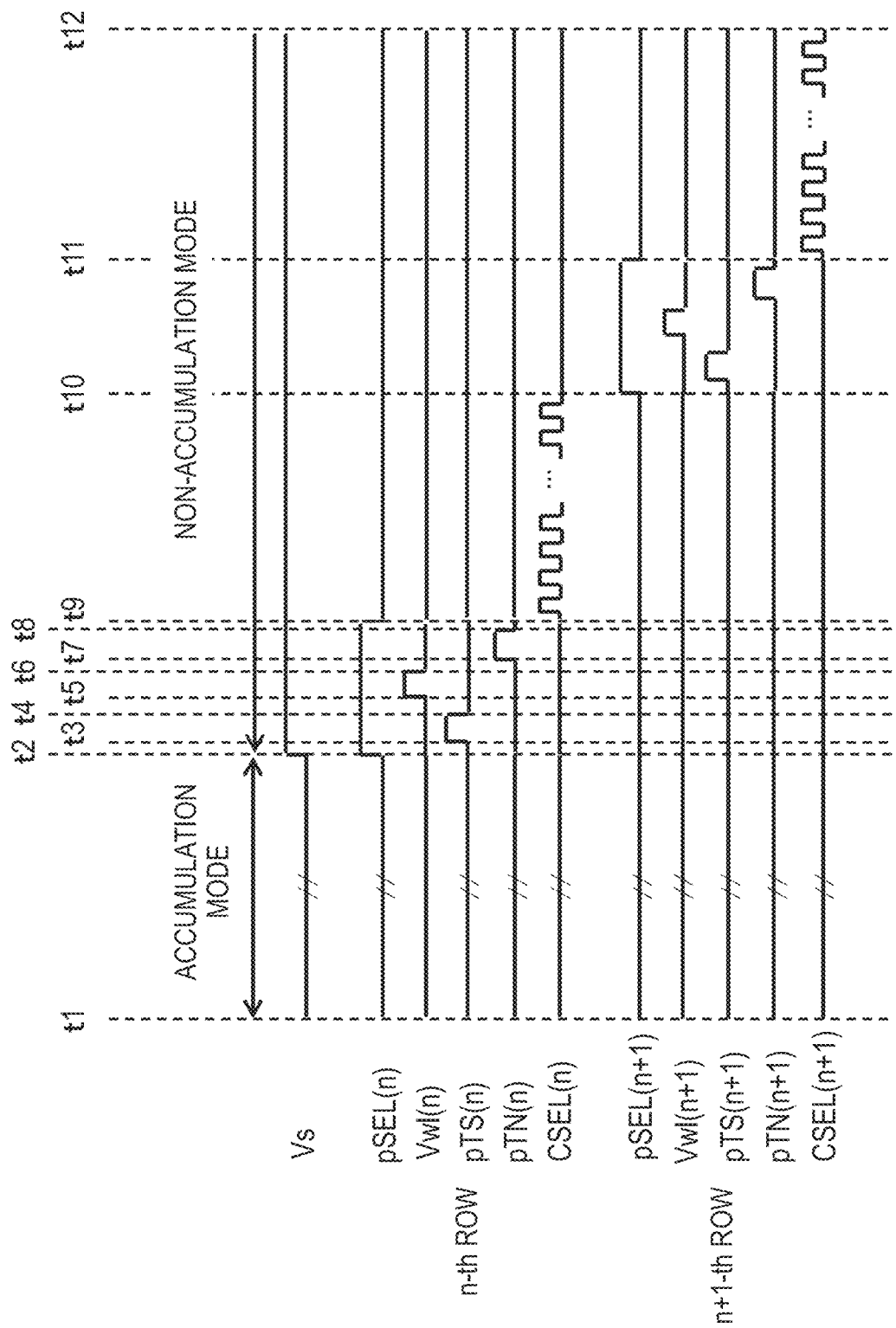

PHOTOELECTRIC CONVERSION APPARATUS AND IMAGING SYSTEM

BACKGROUND OF THE INVENTION

Field of the Invention

The present invention relates to a photoelectric conversion apparatus and an imaging system and, more particularly, to such a technique that noises generated by a dark current or the like which is caused in a pixel are reduced while suppressing an increase in pixel size.

Description of the Related Art

A laminated photoelectric conversion apparatus has been proposed as a photoelectric conversion apparatus which is used in an image sensor or the like of a camera. For example, in a photoelectric conversion apparatus disclosed in International Publication No. WO2011/058684, a photoelectric conversion layer is laminated on a semiconductor substrate and a common electrode and a pixel electrode are arranged over and below the photoelectric conversion layer, respectively.

A pixel illustrated in FIG. 1 of International Publication No. WO2011/058684 has a reset transistor and a reset controlling capacitor and signal charges accumulated in the photoelectric conversion layer are drained by controlling the reset transistor. At this time, according to the pixel of International Publication No. WO2011/058684, by executing a resetting operation (zero biased resetting operation) while maintaining a voltage difference between an impurity diffused portion connected to a pixel electrode and a semiconductor substrate to almost 0V, a leakage current (dark current) flowing between the impurity diffused portion and the semiconductor substrate is reduced. In addition, by providing a feedback loop between a feedback amplifier arranged every column and a reset transistor arranged every pixel and executing the resetting operation, reset noises are reduced.

SUMMARY OF THE INVENTION

However, there is such a problem that in order to execute the zero biased resetting operation, it is necessary that the reset transistor in the pixel construction disclosed in International Publication No. WO2011/058684, it is necessary that the reset controlling capacitor, and wirings for controlling them are formed in the pixel, so that a pixel size increases.

According to an aspect of the present invention, there is provided a photoelectric conversion apparatus comprising a semiconductor substrate, a plurality of pixels, and a controlling unit, wherein: each of the plurality of pixels has a photoelectric conversion unit and a diode; the photoelectric conversion unit has a first electrode layer, a second electrode layer provided between the first electrode layer and the semiconductor substrate, and a photoelectric conversion layer provided between the first electrode layer and the second electrode layer; the diode has a first impurity diffused portion of a first conductivity type and a second impurity diffused portion of a second conductivity type; the second electrode layer is connected to the first impurity diffused portion; and the controlling unit applies a voltage adapted to set the first impurity diffused portion and the second impurity diffused portion into a forwardly biased state and a voltage adapted to set the first impurity diffused portion and the second impurity diffused portion into a reversely biased state to the diode, respectively.

According to the invention, such a photoelectric conversion apparatus and an imaging system that noises generated by a dark current or the like which is caused in a pixel can be reduced while suppressing an increase in pixel size can be provided.

Further features of the present invention will become apparent from the following description of exemplary embodiments with reference to the attached drawings.

BRIEF DESCRIPTION OF THE DRAWINGS

FIGS. 9A and 9B are diagrams schematically illustrating potential distribution in a photoelectric conversion unit of the photoelectric conversion apparatus according to the first embodiment.

FIG. 10 is a diagram illustrating a timing chart of a controlling method of the photoelectric conversion apparatus according to the first embodiment.

DESCRIPTION OF THE EMBODIMENTS

Figure 1:
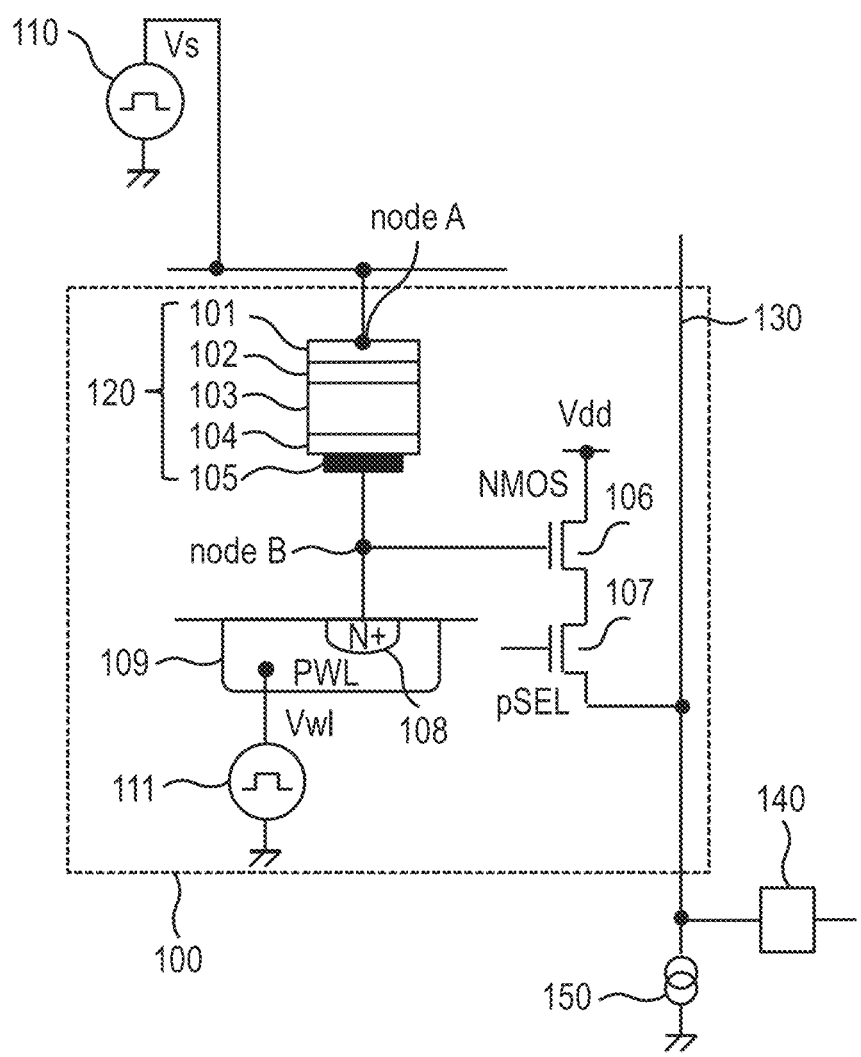
FIG. 1 is a diagram schematically illustrating a construction of a pixel of a photoelectric conversion apparatus according to the first embodiment.

Preferred embodiments of the present invention will now be described in detail in accordance with the accompanying drawings.

The present invention relates to a photoelectric conversion apparatus which is used in an image sensor or the like of a camera. The photoelectric conversion apparatus of the invention includes a semiconductor substrate and a photoelectric conversion unit laminated on the semiconductor substrate. The photoelectric conversion unit is constructed so as to photoelectrically convert incident light into signal charges. It is not always necessary that the whole photoelectric conversion unit has a function of photoelectric conversion. A circuit unit for reading out a signal based on the signal charges generated in the photoelectric conversion unit is arranged on the semiconductor substrate. In several embodiments, which will be described hereinbelow, the photoelectric conversion apparatus includes a plurality of pixels and a plurality of circuit units are arranged in correspondence to the plurality of pixels. Each of the plurality of circuit units may include an amplification unit for amplifying the signal.

Exemplary embodiments of the present invention will now be described hereinbelow in detail in accordance with the accompanying drawings. The invention is not limited to the following embodiments but can be properly modified within a range without departing from an essence of the invention. It is now assumed that, in each of the following drawings, component elements having the same or corresponding functions are designated by the same reference numerals and their description may be omitted or simplified.

First Embodiment

FIG. 1 is a diagram schematically illustrating a construction of a pixel 100 of the photoelectric conversion apparatus according to the first embodiment. The pixel 100 is constructed so as to have a photoelectric conversion unit 120, an amplification transistor 106, a selection transistor 107, a voltage controlling unit 111, and a diode, which will be described hereinafter. The photoelectric conversion unit 120 has a first electrode layer 101, a first blocking layer 102, a photoelectric conversion layer 103, a second blocking layer 104, and a second electrode layer 105.

In FIG. 1, the first electrode layer 101 is arranged over a semiconductor substrate (not shown) (refer to FIG. 7, which will be described hereinafter) of the pixel 100. The first electrode layer 101 is a common electrode which is shared by a plurality of pixels 100. The second electrode layer 105 is arranged between the first electrode layer 101 and the semiconductor substrate. The second electrode layer 105 is a pixel electrode provided every pixel 100.

The first blocking layer 102, the photoelectric conversion layer 103, and the second blocking layer 104 are arranged between the first electrode layer 101 and the second electrode layer 105. The first blocking layer 102 and the second blocking layer 104 block such a phenomenon that electrons or holes leak into the photoelectric conversion layer 103. Thus, a dark current flowing into the pixel 100 is reduced.

The first electrode layer 101 is connected to a voltage controlling unit 110 through a node A. The voltage controlling unit 110 supplies an electrode voltage Vs to the first electrode layer 101.

Figure 3:
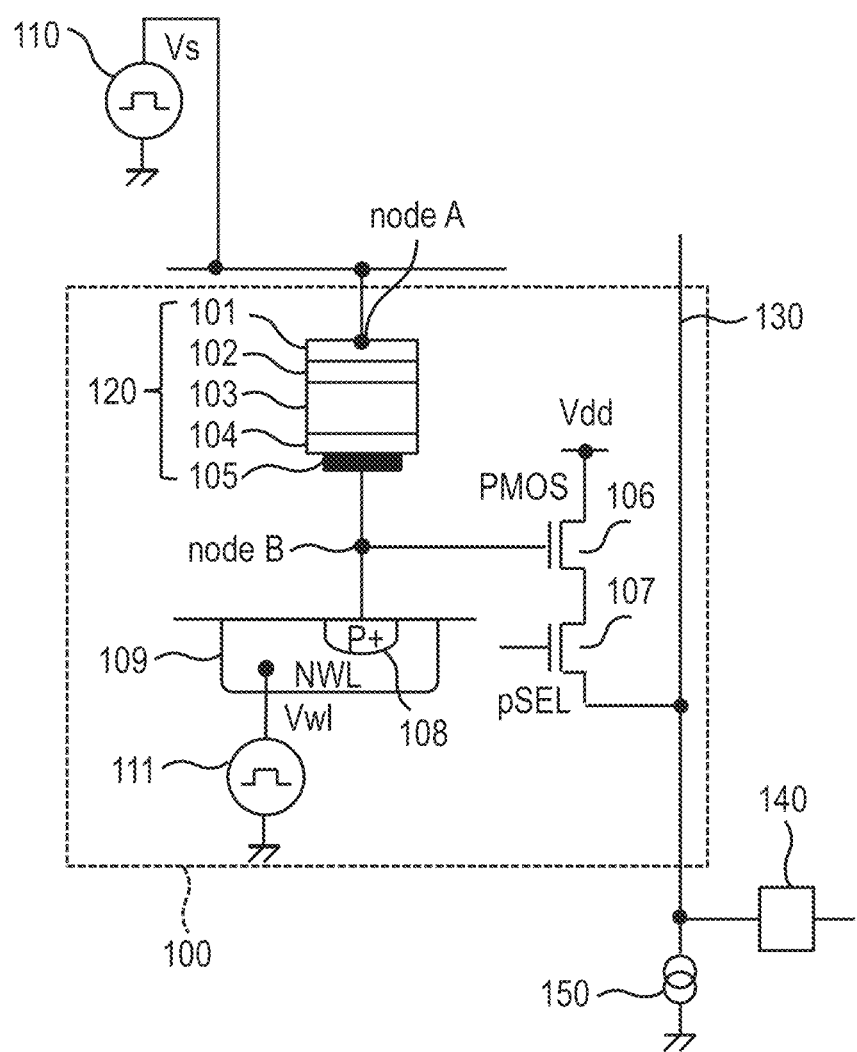
FIG. 3 is a diagram illustrating a modification of the construction of the pixel illustrated in FIG. 1.

The second electrode layer 105 is connected to a first impurity diffused portion 108 of a first conductivity type in the semiconductor substrate through a node B. The first impurity diffused portion 108 is formed in a second impurity diffused portion 109 of a second conductivity type. FIG. 1 illustrates an example in the case where the first conductivity type is an N type and the second conductivity type is a P type. As illustrated in FIG. 3, which will be described hereinafter, the first conductivity type may be set to the P type and the second conductivity type may be set to the N type. In FIG. 1, a pixel well (PWL) of the P type in the semiconductor substrate is used as a second impurity diffused portion 109. A PN junction portion between the first impurity diffused portion 108 and the second impurity diffused portion 109 forms a diode.

The voltage controlling unit 111 of the embodiment is connected to the second impurity diffused portion 109 and is characterized by executing the zero biased resetting operation in such a manner that a voltage across terminals of the diode at the time of executing the resetting operation is set to almost 0V. Although the more specific resetting operation will be described hereinafter, in the embodiment, it is characterized in that signal charges accumulated in the node B are drained by setting the diode into a forwardly biased state by using diode characteristics of the PN junction portion. The node B is set into a floating state at timing other than the reset timing.

In this manner, the diode including the PN junction portion between the first impurity diffused portion 108 and the second impurity diffused portion 109 is combined with the voltage controlling unit 111 and functions as a reset switch for draining the signal charges accumulated in the node B. Since a region of the first impurity diffused portion 108 can be formed in a very small size, in the embodiment, the reset switch of the pixel 100 can be formed in a small size and a pixel size can be reduced.

<Description of Pixel Circuit>

The node B is also connected to a gate electrode of the amplification transistor 106. An amplification unit including the amplification transistor 106 amplifies a signal based on the signal charges photoelectrically converted by the photoelectric conversion unit 120. That is, the gate electrode of the amplification transistor 106 is an input node of the amplification unit. A power source voltage Vdd of, for example, 3.3V is supplied to a drain electrode of the amplification transistor 106.

A source electrode of the amplification transistor 106 is connected to an output line 130 through the selection transistor 107. The amplification transistor 106 and a current source 150 construct a source-follower circuit and outputs the signal based on the signal charges accumulated in the node B to the output line 130. The signal which was output to the output line 130 is input to a column circuit 140. Each of the amplification transistor 106 and the selection transistor 107 illustrated in FIG. 1 is constructed by an NMOS.

<Feature and Effects of the Embodiment>

Figure 2:
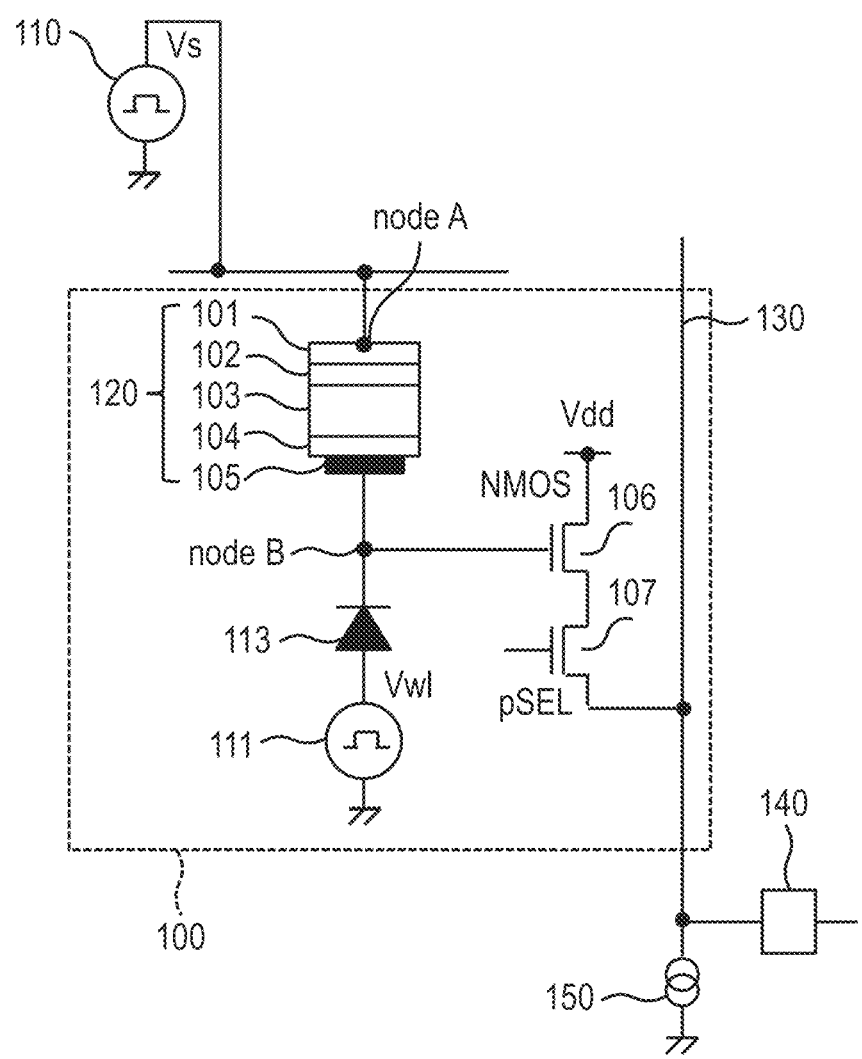
FIG. 2 is a diagram illustrating an equivalence circuit of the pixel of the photoelectric conversion apparatus according to the first embodiment.

FIG. 2 is a diagram illustrating an equivalence circuit of the pixel 100 of the photoelectric conversion apparatus according to the first embodiment. In FIG. 2, the PN junction portion between the first impurity diffused portion 108 and the second impurity diffused portion 109 is expressed as a diode 113. Since other portions are substantially the same as those in FIG. 1, their description is omitted.

In, FIG. 2, the first impurity diffused portion 108 as a first terminal of the diode 113 is connected to the second electrode layer 105 through the node B. The second impurity diffused portion 109 as a second terminal of the diode 113 is connected to the voltage controlling unit 111. The voltage controlling unit 111 of the embodiment is characterized in that a pixel well voltage Vw1 which is applied to the second impurity diffused portion 109 is controlled and the signal charges accumulated in the node B are reset. When the node B is reset, the voltage controlling unit 111 controls the pixel well voltage Vw1 in such a manner that the diode 113 is set into a forwardly biased state by using forward direction characteristics of the diode 113.

The voltage controlling unit 111 controls the pixel well voltage Vw1 in such a manner that, for an accumulation period during which the signal charges are accumulated in the node B after the resetting, the diode 113 is set into a reversely biased state. At this time, by zero bias driving in such a manner that a voltage across the terminals of the diode 113 is set into almost 0V, such a phenomenon that a dark current flows into the first impurity diffused portion 108 during the accumulation period can be suppressed.

In this manner, when the node B is reset by using the forward direction characteristics of the diode 113, by setting the bias which is applied to the PN junction portion of the diode 113 to almost 0V, the PN junction portion is set to about a diffusion potential of a thermal equilibrium state. In the case of executing the zero biased resetting operation by using the reset transistor in the related art, a variation of the dark current caused by a variation or the like of an operation point of the reset transistor exists. However, according to the construction of the embodiment, such a variation of the dark current can be suppressed.

Since the reset transistor which is necessary in the related art can be omitted, the pixel size can be reduced. Further, since the resetting is performed by using switching characteristics of the diode, the resetting operation can be executed at a high speed.

<Modification>

FIG. 3 is a diagram illustrating a modification of the construction of the pixel 100 illustrated in FIG. 1. Although the construction of the pixel 100 in the case where the electrons are used as signal charges is illustrated in FIG. 1, a construction of the pixel 100 in the case where the holes are used as signal charges is illustrated in FIG. 3. More specifically speaking, in FIG. 3, the first impurity diffused portion 108 of the P type is formed in the second impurity diffused portion 109 of the N type. In FIG. 3, an N type pixel well (NWL) of the semiconductor substrate is used as a second impurity diffused portion 109.

In FIG. 1, the pixel well voltage Vw1 which is applied to the P type second impurity diffused portion 109 is controlled and the electrons which are accumulated in the node B are drained. On the other hand, in FIG. 3, the pixel well voltage Vw1 which is applied to the N type second impurity diffused portion 109 is controlled and the holes which are accumulated in the node B are drained. Each of the amplification transistor 106 and the selection transistor 107 of the embodiment illustrated in FIG. 3 is constructed by a PMOS. According to such a construction, even in the case where the holes are used as signal charges, an effect similar to that in the case where the electrons are used as signal charges can be obtained.

<Description of Whole Apparatus>

Figure 4:
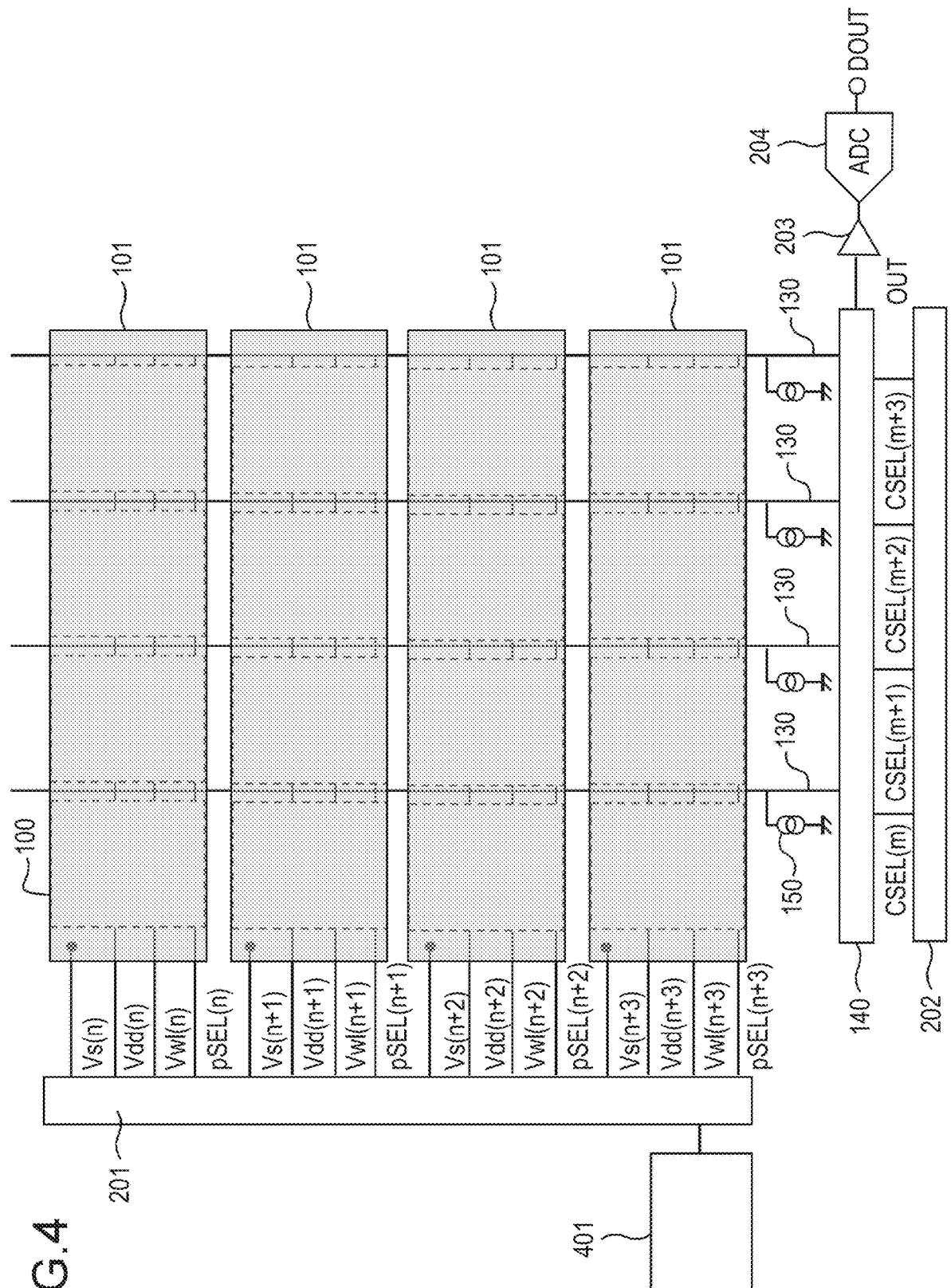
FIG. 4 is a diagram schematically illustrating a whole circuit construction of the photoelectric conversion apparatus according to the first embodiment.

FIG. 4 is a diagram schematically illustrating a whole circuit construction of the photoelectric conversion apparatus according to the first embodiment. Component elements having the same functions as those in FIG. 1 are designated by the same reference numerals. Although sixteen pixels 100 arranged in a matrix form of 4 rows and 4 columns are illustrated in FIG. 4, the actual photoelectric conversion apparatus has further many pixels 100. Although an internal construction of the pixel 100 is not illustrated in FIG. 4, the internal construction of the pixel 100 is substantially the same as that illustrated in FIG. 1 or 3.

The plurality of pixels 100 of the same column illustrated in FIG. 4 are connected to the corresponding output line 130. A row driving circuit 201 supplies the electrode voltage Vs, the power source voltage Vdd, the pixel well voltage Vw1, and a driving signal pSEL to the pixels 100 every row. A power source controlling unit 401 illustrated in FIG. 4 includes the voltage controlling units 110 and 111 illustrated in FIG. 1. The selection transistor 107 of the pixels 100 is controlled by the driving signal pSEL which is supplied to a gate. In FIG. 4, in order to distinguish driving signals which differ every row, row numbers with parentheses such as (n), (n+1), and the like are added to the signals which are supplied from the row driving circuit 201. This is true of other drawings.

A plane structure of the first electrode layer 101 held in the photoelectric conversion unit 120 is also illustrated in FIG. 4. As illustrated in FIG. 4, the first electrode layers 101 of the plurality of pixels 100 of the same row construct a common first terminal (node A illustrated in FIG. 1) of the photoelectric conversion units 120. That is, in the embodiment, the common first electrode layer 101 is arranged every row. The row driving circuit 201 selects the pixel 100 every row and supplies the electrode voltage Vs which is output from the voltage controlling unit 110 of the power source controlling unit 401 to the first electrode layer 101 of the selected pixel 100.

Figure 5:
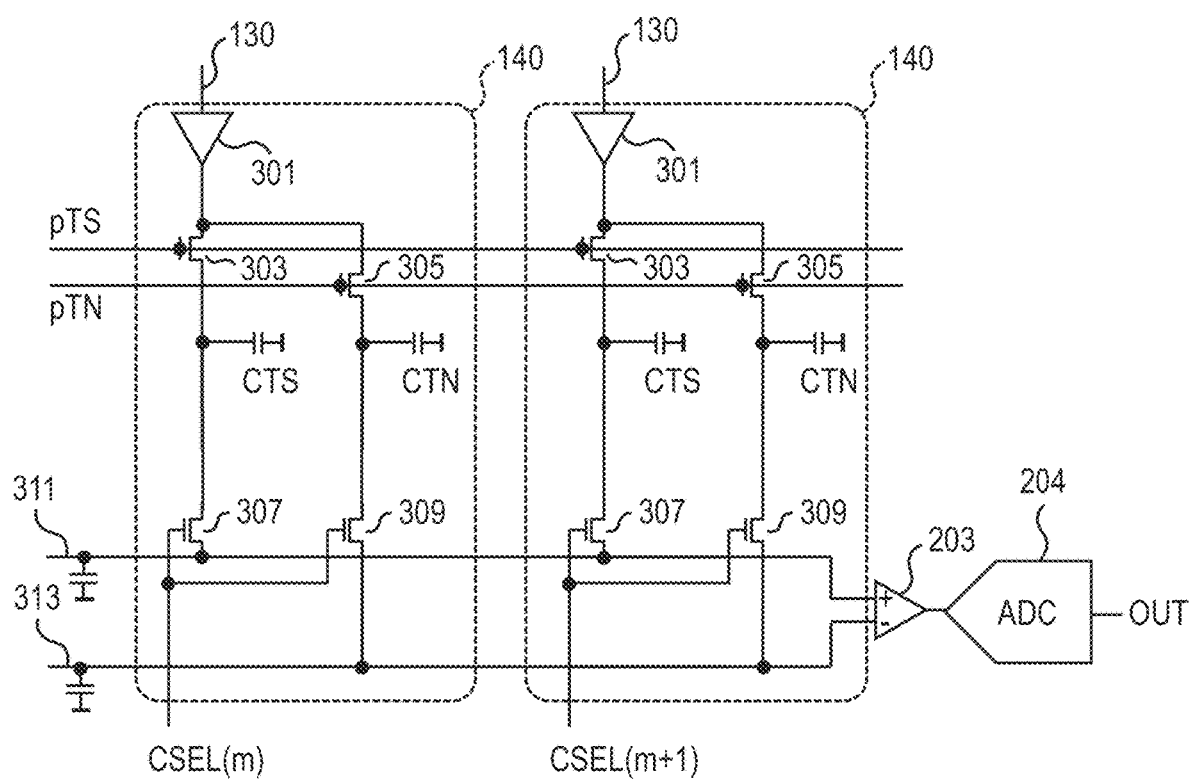
FIG. 5 is a diagram schematically illustrating a construction of a column circuit of the photoelectric conversion apparatus according to the first embodiment.

Each output line 130 provided every column is connected to the column circuit 140 of the same column Although the column circuits 140 are simplified and illustrated as one block in FIG. 4, actually, the column circuit 140 is provided every column as illustrated in FIG. 5, which will be described hereinafter. A column driving circuit 202 drives the column circuit 140 every column. The column driving circuit 202 supplies a driving signal CSEL to the column circuit 140. In FIG. 4, in order to distinguish driving signals which differ every column, column numbers with parentheses such as (m), (m+1), and the like are added to the signals which are supplied from the column driving circuit 202. This is true of other drawings. The signals which were read out every row in parallel are output to an output amplifier 203 and an A/D conversion unit 204 at the post stage.

The column circuit 140 illustrated in FIG. 4 will now be described in detail. FIG. 5 is a diagram schematically illustrating a construction of the column circuit 140 of the photoelectric conversion apparatus according to the first embodiment. Although only equivalence circuits of the column circuits 140 of the m-th column and the m+1-th column are illustrated in FIG. 5, each of other column circuits 140 (not shown) also has a similar construction.

The signal which was output to the output line 130 is amplified by a column amplifier 301. The signal amplified by the column amplifier 301 is output to a capacitor CTS through an S/H (sampling/holding) switch 303 and is S/H (sampled/held). Similarly, the signal amplified by the column amplifier 301 is output to a capacitor CTN through an S/H switch 305 and is S/H (sampled/held). The S/H switch 303 is controlled by a driving signal pTS. The S/H switch 305 is controlled by a driving signal pTN.

According to such a construction, a reference signal N containing an influence of a variation of a threshold value of the amplification transistor 106 is held in the capacitor CTN. A pixel signal S in which the influence of the threshold value variation of the amplification transistor 106 has been added to a photo signal is held in the capacitor CTS. The capacitor CTS is connected to a horizontal output line 311 through a horizontal transfer switch 307. The capacitor CTN is connected to a horizontal output line 313 through a horizontal transfer switch 309. The horizontal transfer switches 307 and 309 are controlled by the driving signal CSEL which is output from the column driving circuit 202.

The horizontal output lines 311 and 313 are connected to the output amplifier 203. The output amplifier 203 outputs a difference between the pixel signal S which was output to the horizontal output line 313 and the reference signal N which was output to the horizontal output line 311 to the A/D conversion unit 204 at the post stage. By obtaining the difference between the pixel signal S and the reference signal N as mentioned above, the influence of the threshold value variation of the amplification transistor 106 can be set off and eliminated. The A/D conversion unit 204 converts an input analog signal into a digital signal.

The column circuit 140 may be an analog/digital (A/D) conversion circuit. In this case, the A/D conversion circuit has a holding unit for holding a digital signal such as memory, counter, or the like. The reference signal N and the pixel signal S are converted into digital signals and held, respectively.

<Description of Plane Structure/Cross Sectional Structure>

Figure 6:
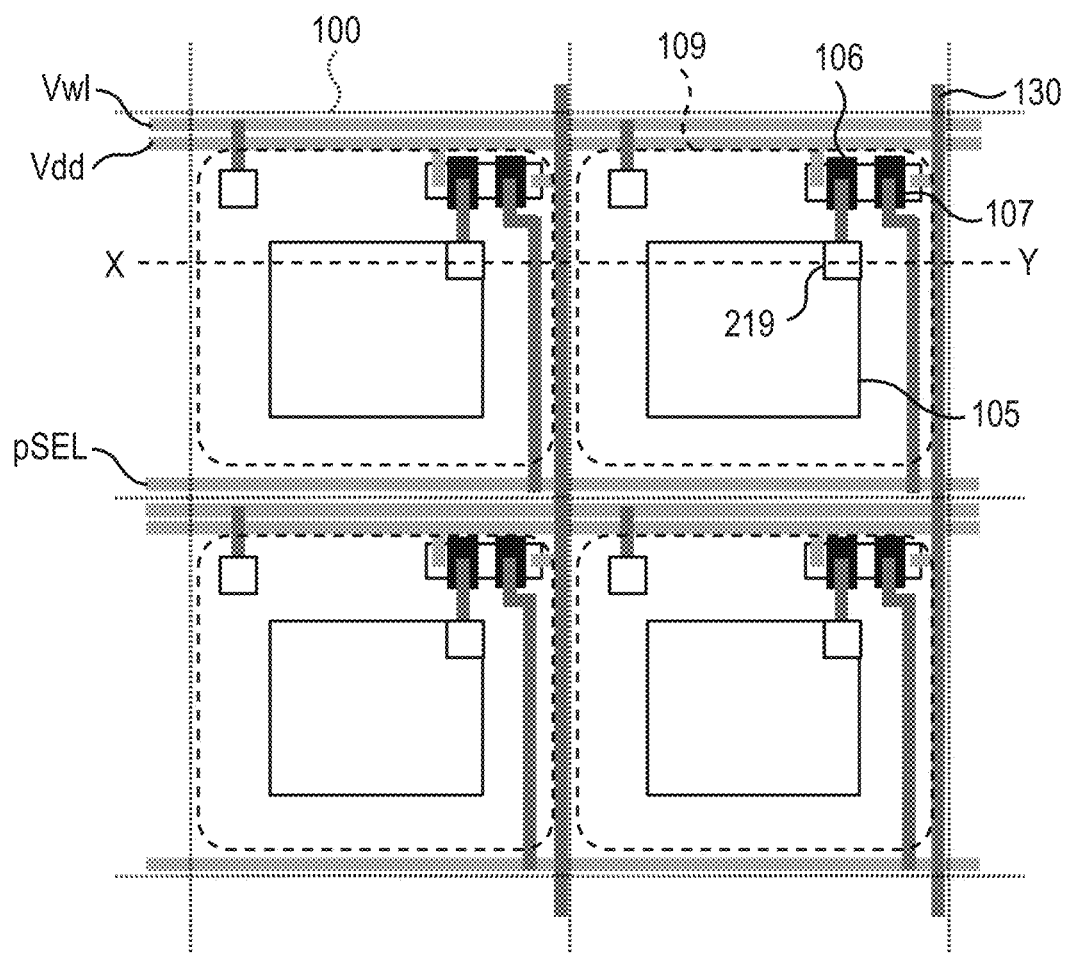
FIG. 6 is a diagram schematically illustrating a plane structure of the pixel of the photoelectric conversion apparatus according to the first embodiment.

FIG. 6 is a diagram schematically illustrating a plane structure of the pixel 100 of the photoelectric conversion apparatus according to the first embodiment. Although the plane structures of the four pixels 100 in total of 2 rows and 2 columns arranged in a matrix form are illustrated in FIG. 6, each of other pixels 100 (not shown) also has a similar structure. With respect to each transistor held by the pixels 100, a corresponding gate electrode is designated by a reference numeral. In FIG. 6, only the second electrode layer 105 of the lowest layer of the photoelectric conversion unit 120 is illustrated and other layers of the photoelectric conversion unit 120 are not shown.

Figure 7:
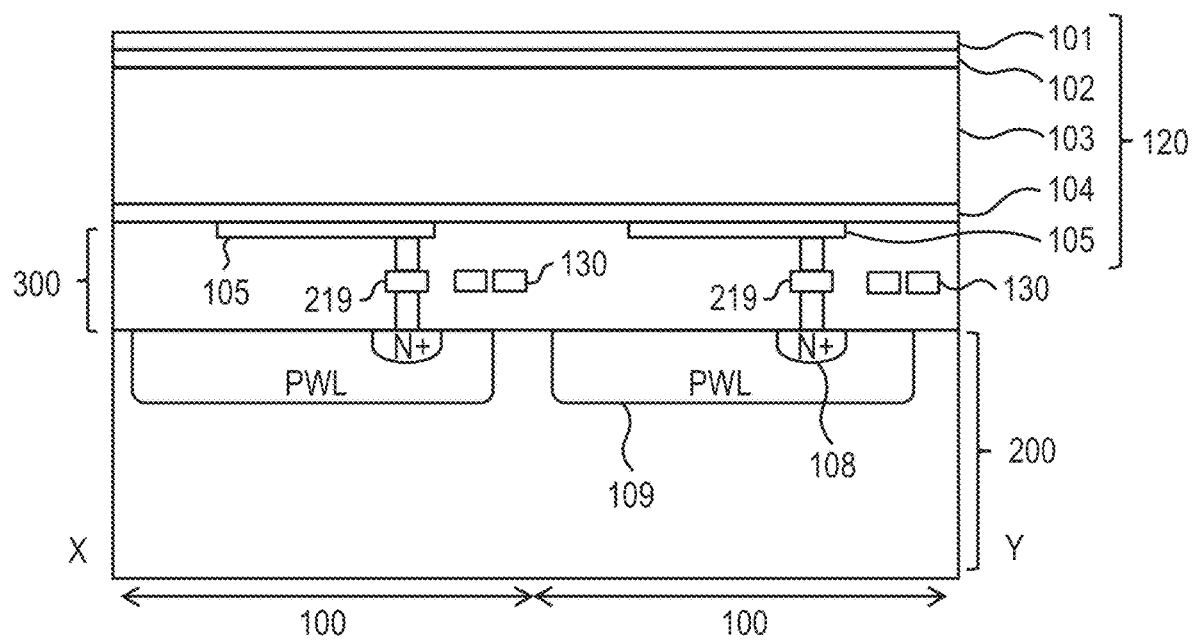
FIG. 7 is a diagram schematically illustrating a cross sectional structure of the pixel of the photoelectric conversion apparatus according to the first embodiment.

FIG. 7 is a diagram schematically illustrating a cross sectional structure of the pixel 100 of the photoelectric conversion apparatus according to the first embodiment. The cross sectional structure of the pixel 100 of the photoelectric conversion apparatus taken along the line X-Y illustrated in FIG. 6 is illustrated in FIG. 7. Component elements having the same functions as those in FIG. 1 are designated by the same reference numerals. Each layer laminated on the second electrode layer 105 of the photoelectric conversion unit 120 is also illustrated in FIG. 7.

A plane structure and a cross sectional structure of the pixel 100 in the photoelectric conversion apparatus according to the embodiment will be described hereinbelow with reference to FIGS. 6 and 7. The photoelectric conversion apparatus has a semiconductor substrate 200. The second impurity diffused portion 109 is formed in the semiconductor substrate 200. In FIGS. 6 and 7, a P type pixel well (PWL) of the semiconductor substrate 200 is used as a second impurity diffused portion 109. The pixel well voltage Vw1 is applied to the second impurity diffused portion 109.

In the photoelectric conversion apparatus illustrated in FIGS. 6 and 7, the pixel well (PWL) including the second impurity diffused portion 109 is separately provided every pixel 100. The pixel well (PWL) includes a source region and a drain region of the pixel transistor. In this instance, the pixel transistor is a transistor such as amplification transistor 106, selection transistor 107, or the like formed in the pixel 100 and is constructed by an NMOS. The N type first impurity diffused portion 108 is formed in the P type second impurity diffused portion 109. A contact unit 219, a gate electrode of the pixel transistor, and a plurality of wiring layers 300 containing conductive members constructing their wirings or the like are arranged on the semiconductor substrate 200.

The second electrode layer 105, second blocking layer 104, photoelectric conversion layer 103, first blocking layer 102, and first electrode layer 101 are sequentially arranged on the wiring layer 300 and construct the photoelectric conversion unit 120. The second electrode layer 105 as a lowest layer of the photoelectric conversion unit 120 is connected to the gate electrode of the amplification transistor 106 through the contact unit 219.

The first blocking layer 102 of the photoelectric conversion unit 120 blocks such a phenomenon that electrons leak into the photoelectric conversion layer 103 from the first electrode layer 101 when the photoelectric conversion unit 120 is in a reversely biased state. The second blocking layer 104 blocks such a phenomenon that holes leak into the photoelectric conversion layer 103 from the second electrode layer 105 when the photoelectric conversion unit 120 is in a reversely biased state. According to such a construction, the dark current flowing into the pixel 100 is reduced.

As described in FIG. 4, the first electrode layers 101 of the photoelectric conversion unit 120 are electrically insulated every row. The first electrode layers 101 included in the plurality of pixels 100 of the same row are constructed by a common conductive member. Therefore, the first electrode layer 101 is called a common electrode. The second electrode layer 105 of the photoelectric conversion unit 120 is provided every pixel 100 and is electrically insulated from the second electrode layers 105 of the other pixels 100. Therefore, the second electrode is called a pixel electrode. A plurality of pixels 100 of the same column are connected to the corresponding output line 130.

<Modification>

Figure 8:
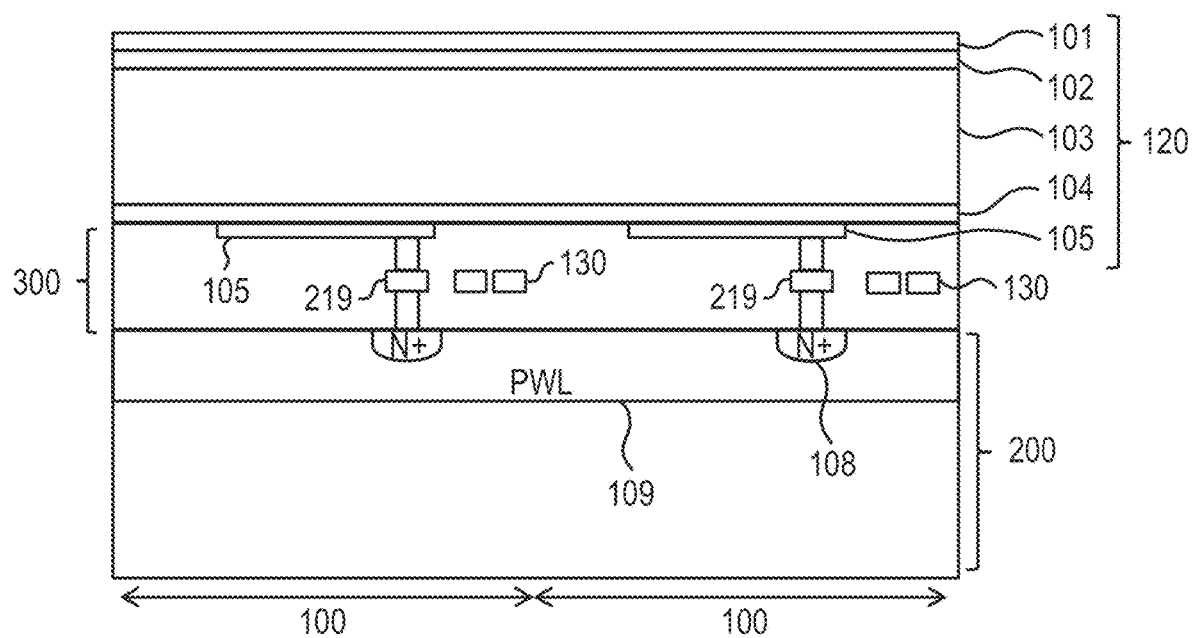
FIG. 8 is a diagram illustrating a modification of the cross sectional structure of the pixel illustrated in FIG. 7.

FIG. 8 is a diagram illustrating a modification of the cross sectional structure of the pixel 100 illustrated in FIG. 7. Since the pixel well (PWL) including the second impurity diffused portion 109 is provided every pixel 100 in foregoing FIG. 7, the pixel well voltage Vw1 can be controlled every pixel 100. Therefore, a rolling shutter operation can be executed in addition to a global shutter operation, which will be described hereinafter. However, as illustrated in FIG. 7, if the second impurity diffused portion 109 is provided every pixel 100, the pixel size increases.

Therefore, in the modification illustrated in FIG. 8, the second impurity diffused portion 109 which is common to the whole pixel region is provided. Thus, the pixel size can be reduced. However, in the modification illustrated in FIG. 8, if it is intended to control the pixel well voltage Vw1 of the second impurity diffused portion 109, an electric potential changes in common for all pixels. Therefore, although the global shutter operation, which will be described hereinafter, can be executed, the rolling shutter operation cannot be executed. In a construction similar to FIG. 8, a form which enables the rolling shutter operation will be described in the second embodiment, which will be described hereinafter.

<Construction of Photoelectric Conversion Unit>

Subsequently, a further specific construction of the photoelectric conversion unit 120 will be described. The first electrode layer 101 of the photoelectric conversion unit 120 is constructed by a conductive member having a high transmittance of light. For example, a compound containing indium or tin such as ITO (Indium Tin Oxide) or the like or a compound such as ZnO or the like is used as a material of the first electrode layer 101.

According to such a construction, since a larger amount of light enters the photoelectric conversion layer 103, a sensitivity of the photoelectric conversion unit 120 can be improved. As another construction, polysilicon or metal having a thickness enough to transmit light of a predetermined amount may be used as a first electrode layer 101. Since a resistance of metal is low, a construction using metal as a material of the first electrode layer 101 is advantageous for realization of low electric power consumption or a high driving speed.

The first blocking layer 102 is arranged between the first electrode layer 101 and the photoelectric conversion layer 103. As a first blocking layer 102, a semiconductor of the N type or P type having the same kind as that of the semiconductor which is used for the photoelectric conversion layer 103 and having an impurity concentration higher than that of the semiconductor which is used for the photoelectric conversion layer 103 can be used.

For example, when a-Si (amorphous-Silicon) is used for the photoelectric conversion layer 103, N type a-Si having a high impurity concentration or P type a-Si having a high impurity concentration is used for the first blocking layer 102. Since a position of a Fermi level differs in dependence on a difference of the impurity concentration, a potential barrier can be formed for only ones of the electrons and the holes. Although such a phenomenon that the electric charges leak from the electrode to ones of the electrons and the holes can be suppressed (blocked), an injection of the electric charges from the electrode is promptly performed to the other ones of the electrons and the holes.

Or, the first blocking layer 102 can be also made of a material different from that of the photoelectric conversion layer 103. According to such a construction, a heterojunction is formed. Since a band gap of the heterojunction differs in dependence on a difference of the material, the potential barrier can be similarly formed for only ones of the electrons and the holes.

The photoelectric conversion layer 103 photoelectrically converts the light which entered the photoelectric conversion layer 103 into signal charges. As for the photoelectric conversion layer 103, it is sufficient that at least a partial region has such a photoelectric converting function. The photoelectric conversion layer 103 is made of a semiconductor material such as intrinsic a-Si, P type a-Si of a low concentration, N type a-Si of a low concentration, or the like.

Or, the photoelectric conversion layer 103 may be made of a compound semiconductor material. For example, a III-V compound semiconductor such as BN, GaAs, GaP, AlSb, GaAlAsP, or the like, II-VI compound semiconductor such as CdSe, ZnS, HdTe, or the like, or IV-VI compound semiconductor such as PbS, PbTe, CuO, or the like is mentioned.

Or, the photoelectric conversion layer 103 may be made of an organic semiconductor material. For example, fullerence, coumalin 6 (C6), rhodamine 6G (R6G), zinc phthalocyanine (ZnPc), quinacridone, phthalocyanine system compound, naphthalocyanine system compound, or the like can be used. Further, a layer containing quantum dots made of the foregoing semiconductor material can be also used as a photoelectric conversion layer 103. The quantum dot is a particle having a grain diameter of 20.0 nm or less.

When the photoelectric conversion layer 103 is made of the semiconductor material, it is sufficient to decrease an impurity concentration of the semiconductor material or use an intrinsic semiconductor. According to such a construction, since a depletion layer can be sufficiently widened into the photoelectric conversion layer 103, effects such as realization of a high sensitivity of the photoelectric conversion unit 120, noise reduction, and the like can be obtained.

The second blocking layer 104 is arranged between the photoelectric conversion layer 103 and the second electrode layer 105. As a second blocking layer 104, in a manner similar to the first blocking layer 102, a semiconductor of the N type or P type having the same kind as that of the semiconductor which is used for the photoelectric conversion layer 103 and having an impurity concentration higher than that of the semiconductor which is used for the photoelectric conversion layer 103 can be used.

For example, when a-Si is used for the photoelectric conversion layer 103, N type a-Si having a high impurity concentration or P type a-Si having a high impurity concentration is used for the second blocking layer 104. Or, the second blocking layer 104 can be also made of a material different from the photoelectric conversion layer 103.

The first blocking layer 102 and the second blocking layer 104 are made so that the photoelectric conversion unit 120 has diode characteristics. For example, when the P type semiconductor is used for the first blocking layer 102, the N type semiconductor is used for the second blocking layer 104. In this case, the electrons are used as signal charges.

For the second electrode layer 105, a conductive member such as a metal or the like constructing the wirings or the same material as a conductive member constructing the pad electrodes for connecting to an outside of the photoelectric conversion unit 120 is used. According to such a construction, since the second electrode layer 105 can be formed simultaneously with the wirings and the pad electrodes, a manufacturing process can be simplified and low costs can be accomplished.

<Description of Function and Shutter Operation of Photoelectric Conversion Unit>

Subsequently, a function and the operation of the photoelectric conversion unit 120 in the pixel 100 of the embodiment will be described. FIGS. 9A and 9B are diagrams schematically illustrating potential distribution in the photoelectric conversion unit 120 of the photoelectric conversion apparatus according to the first embodiment. FIG. 9A illustrates the potential distribution in an accumulation mode in which the signal charges generated in the photoelectric conversion layer 103 are accumulated. FIG. 9B illustrates the potential distribution in a non-accumulation mode in which the signal charges generated in the photoelectric conversion layer 103 are not accumulated.

An energy band in each layer of the first electrode layer 101, first blocking layer 102, photoelectric conversion layer 103, second blocking layer 104, and second electrode layer 105 constructing the photoelectric conversion unit 120 are illustrated in FIGS. 9A and 9B. FIGS. 9A and 9B illustrate an example in which the electrons are the signal charges, the electrons are shown by black dots, and the holes are shown by white circles. As mentioned above, the first blocking layer 102 blocks such a phenomenon that the electrons leak into the photoelectric conversion layer 103 from the first electrode layer 101. The second blocking layer 104 blocks such a phenomenon that the holes leak into the photoelectric conversion layer 103 from the second electrode layer 105.

The first blocking layer 102 and the photoelectric conversion layer 103 illustrated in FIGS. 9A and 9B are made of the same semiconductor material and construct a homojunction. In order to realize the blocking characteristics, impurity concentrations of the first blocking layer 102 and the photoelectric conversion layer 103 are different. For example, the first blocking layer 102 is made of a P type semiconductor material and the photoelectric conversion layer 103 is made of an intrinsic semiconductor in which no impurities are added. Similarly, the second blocking layer 104 and the photoelectric conversion layer 103 are made of the same semiconductor material and their impurity concentrations are different. For example, the second blocking layer 104 is made of an N type semiconductor material and the photoelectric conversion layer 103 is made of an intrinsic semiconductor in which no impurities are added.

An axis of ordinate in FIGS. 9A and 9B indicates a magnitude of a potential to the electron. For example, as a voltage which is applied to the first electrode layer 101 or the like is lower, the potential to the electron increases to a higher level. On the contrary, as the voltage which is applied is higher, the potential to the electron decreases to a lower level. Fermi levels Ef1 and Ef3 of the electrons in the first electrode layer 101 and a Fermi level Ef2 of the electrons in the second electrode layer 105 are illustrated in FIGS. 9A and 9B. A band gap between a conduction band and a valence band in each of the first blocking layer 102, photoelectric conversion layer 103, and second blocking layer 104 is also illustrated in FIGS. 9A and 9B.

<Accumulation Mode Operation>

FIG. 9A illustrates the potential distribution of the photoelectric conversion unit 120 in an accumulation mode. In the accumulation mode, the signal charges generated in the photoelectric conversion layer 103 are accumulated. In order to set the photoelectric conversion unit 120 into the accumulation mode, for example, an electrode voltage Vs1 of 0V is applied to the first electrode layer 101 and the photoelectric conversion unit 120 is set into a reversely biased state. Thus, the photoelectric conversion layer 103 is set into a depletion state.

The electrons among the carriers which were photoelectrically converted and pair-generated in the photoelectric conversion layer 103 are drifted to the second electrode layer 105 by a reverse bias and are accumulated. Thus, the electric potential of the node B in a floating state connected to the second electrode layer 105 changes in accordance with an amount of accumulated signal charges. In the accumulation mode illustrated in FIG. 9A, since the photoelectric conversion unit 120 is set into the reversely biased state, such a situation that the electrons leak into the photoelectric conversion layer 103 from the first electrode layer 101 is blocked by the first blocking layer 102. Thus, the dark current is reduced. When the accumulation of the signal charges progresses in the second electrode layer 105, the photoelectric conversion layer 103 approaches a flat band state.

On the other hand, the holes among the carriers which were photoelectrically converted and pair-generated in the photoelectric conversion layer 103 are drifted to the first electrode layer 101 by a reverse bias and are drained to the outside of the photoelectric conversion unit 120. Therefore, the holes do not contribute as signal charges. In the accumulation mode illustrated in FIG. 9A, since the photoelectric conversion unit 120 is set into the reversely biased state, such a situation that the holes leak into the photoelectric conversion layer 103 from the second electrode layer 105 is blocked by the second blocking layer 104. Thus, the dark current is reduced.

<Non-Accumulation Mode Operation>

FIG. 9B illustrates the potential distribution of the photoelectric conversion unit 120 in a non-accumulation mode.

In the non-accumulation mode, the signal charges generated in the photoelectric conversion layer 103 are not accumulated. In order to set the photoelectric conversion unit 120 into the non-accumulation mode, for example, a same electrode voltage Vs2 of 3.3V as a reset voltage Vres of the node B is applied to the first electrode layer 101. In the case of accumulating the electrons as signal charges, there is a relation of Vs2>Vs1.

The photoelectric conversion layer 103 in the non-accumulation mode is in a state near the flat band. Therefore, the holes hardly leak into the photoelectric conversion layer 103 from the first electrode layer 101. Even if the holes leaked, since a bias voltage applied to the photoelectric conversion layer 103 is small, the leaked holes are not combined again with the electrons accumulated in the second electrode layer 105. The electrons generated in the photoelectric conversion layer 103 are not accumulated in the second electrode layer 105. Consequently, in the non-accumulation mode, even in a state where the light is irradiated to the photoelectric conversion unit 120, the signal charges accumulated in the node B of the second electrode are held.

In this manner, by setting the photoelectric conversion unit 120 into the accumulation mode illustrated in FIG. 9A, the accumulation periods of the signal charges can be simultaneously started in all of the pixels 100 (batch reset). By setting the photoelectric conversion unit 120 into the non-accumulation mode illustrated in FIG. 9B, the accumulation periods of the signal charges can be simultaneously finished in all of the pixels 100 (batch shutter). As mentioned above, what is called a global shutter function can be realized.

However, in the circuit of the pixel 100 illustrated in FIG. 1, for a period of time during which the signal based on the signal charges accumulated in the node B is read out, the signal charges by the photoelectric conversion cannot be accumulated into the node B. In a construction similar to that of FIG. 1, a form in which the signal charges can be accumulated into the node B while the signal is read out will be described in an embodiment, which will be explained hereinafter.

<Description of Operation Timing>

Subsequently, a driving method of the photoelectric conversion apparatus according to the embodiment will be described. FIG. 10 is a diagram illustrating a timing chart of a controlling method of the photoelectric conversion apparatus according to the first embodiment. In FIG. 10, for simplicity of explanation, only driving signals in the signal read-out operation for two rows of the n-th row and the n+1-th row are illustrated and driving signals of other rows are not illustrated.

For the accumulation period between time t1 and time t2, the electrode voltage Vs1 of, for example, 0V is applied to the first electrode layer 101 of each pixel 100 so that the photoelectric conversion unit 120 enters the accumulation mode. During such an accumulation period, the photoelectric conversion is executed in a lump in all of the pixels 100 and the generated signal charges are accumulated into the node B connected to the second electrode layer 105 (batch exposure).

At time t2, the electrode voltage Vs2 of, for example, 3.3V is applied to the first electrode layer 101 of each pixel 100 so that the photoelectric conversion unit 120 enters the non-accumulation mode. Thus, sensitivities of the photoelectric conversion units 120 are set to zero in a lump in all of the pixels 100. At the same time, a driving signal pSEL(n) is set to the high level and the selection transistor 107 of the pixel 100 of the n-th row is turned on. Thus, an output of the amplification transistor 106 of the pixel 100 of the n-th row is connected to the output line 130.

At time t3, a driving signal pTS(n) is set to the high level. At time t4, the driving signal pTS(n) is set to the low level. Thus, the pixel signal S in which an influence of a threshold value variation of the amplification transistor 106 has been added to the photo signal is held in the capacitor CTS of the column circuit 140.

At time t5, a pixel well voltage Vw1(n) of a high level of, for example, 3.3V is applied to the second impurity diffused portion 109. Thus, the diode 113 is set into a forwardly biased state, a forward direction current flows, and the node B is reset to 3.3V (forward bias reset). More strictly speaking, the electric potential of the node B is set to a value which is smaller than 3.3V by a diffusion potential.

At time t6, the pixel well voltage Vw1(n) of a low level of, for example, 0V is applied to the second impurity diffused portion 109. Thus, the diode 113 is set into a reversely biased state and the electric potential of the node B is maintained to 3.3V. The embodiment is characterized in that the diode 113 is made to function as a reset switch by swing controlling the pixel well voltage Vw1 as mentioned above.

In the embodiment, since the pixel well (PWL) including the second impurity diffused portion 109 is provided every pixel 100, the pixel well voltage Vw1 can be controlled every pixel 100. However, since the pixel well (PWL) also functions as a back gate of the pixel transistor such as amplification transistor 106, a selection transistor 107, or the like, in the case of switching controlling the pixel well voltage Vw1, such control is made at timing when the pixel transistor is in an inoperative state.

After that, a driving signal pTN(n) is soon set to the high level at time t7 and is set to the low level at time t8. Thus, the reference signal N containing the influence of the threshold value variation of the amplification transistor 106 is held in the capacitor CTN of the column circuit 140.

At time t9, the driving signal pSEL(n) is set to the low level and the read-out of the signal from the pixel 100 of the n-th row into the column circuit 140 is finished. The read-out reference signal N and pixel signal S are output to the output amplifier 203 every column by the driving signal CSEL. The output amplifier 203 outputs a difference between the pixel signal S and the reference signal N to the A/D conversion unit 204.

At time t10, a driving signal pSEL(n+1) is set to the high level and the selection transistor 107 of the pixel 100 of the n+1-th row is turned on. Subsequently, the read-out of the signal from the pixel 100 of the n+1-th row is executed. Since such an operation is similar to that for a period of time between time t1 and time t9, its description is omitted. During the signal read-out of each row, the electrode voltage Vs2 of, for example, 3.3V is applied to the first electrode layer 101 of the pixel 100 of each row and the non-accumulation mode is set. Subsequently, the signals are similarly sequentially read out until the last row.

After that, the electrode voltage Vs1 of, for example, 0V is applied to the first electrode layer 101 of each pixel 100 and the accumulation mode is set. During the accumulation period, the accumulation mode is set in a lump for all of the pixels 100 and the photo signal charges are accumulated into the node B connected to the second electrode layer 105 (batch exposure).

As mentioned above, the pixel of the embodiment has the photoelectric conversion unit for converting the incident light into the signal charges and the diode connected to the second electrode layer of the photoelectric conversion unit through the node B. The diode has the PN junction portion formed by the first impurity diffused portion of the first conductivity type and the second impurity diffused portion of the second conductivity type. The second impurity diffused portion is a well region formed on the semiconductor substrate. The first impurity diffused portion is formed in the second impurity diffused portion and is connected to the second electrode layer (node B). The controlling unit (voltage controlling unit 111) of the embodiment applies the voltage adapted to set into the forwardly biased state and the voltage adapted to set into the reversely biased state to the portion across the terminals of the diode, respectively. In this manner, the voltage across the terminals of the diode is controlled and the signal charges accumulated in the second electrode layer (node B) is reset.

According to such a construction, the diode constructed by the first impurity diffused portion 108 and the second impurity diffused portion 109 is combined with the voltage controlling unit 111 and functions as a reset switch for draining the signal charges accumulated in the node B. Since a region of the first impurity diffused portion 108 can be formed in a very small size, the reset switch of a small size of the pixel 100 can be formed on the semiconductor substrate.

Thus, since the reset transistor in the related art can be omitted, the photoelectric conversion apparatus in which the noises due to the dark current or the like generated in the pixel 100 can be reduced while suppressing an increase in pixel size can be provided. Since the reset is performed by using the switching characteristics of the diode, the resetting operation can be executed at a high speed.

Second Embodiment

Figure 11:
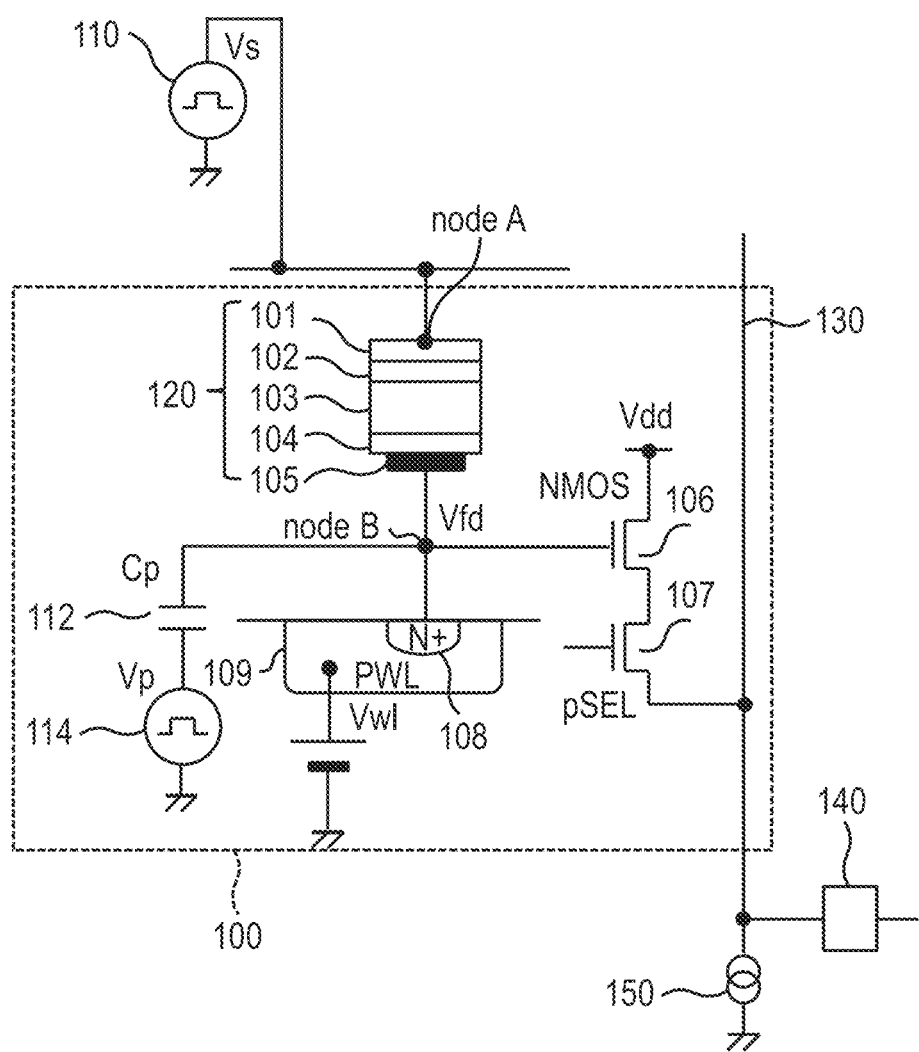
FIG. 11 is a diagram schematically illustrating a construction of a pixel of a photoelectric conversion apparatus according to the second embodiment.

FIG. 11 is a diagram schematically illustrating a construction of the pixel 100 of a photoelectric conversion apparatus according to the second embodiment. Component elements having the same functions as those in FIG. 1 are designated by the same reference numerals. A construction different from the first embodiment will be described hereinbelow.

The pixel 100 of the embodiment illustrated in FIG. 11 has a bias controlling capacitor 112 of a capacitance Cp. One end of the bias controlling capacitor 112 is connected to the node B. The other end of the bias controlling capacitor 112 is connected to a voltage controlling unit 114. Thus, the node B is connected to the voltage controlling unit 114 through the bias controlling capacitor 112. In a manner similar to the first embodiment, the node B is connected to the second electrode layer 105 and the N type first impurity diffused portion 108. The voltage controlling unit 114 of the embodiment is characterized by controlling an electric potential Vfd of the node B through the bias controlling capacitor 112.

The pixel well (PWL) including the second impurity diffused portion 109 forms the back gate of the pixel transistor such as amplification transistor 106, selection transistor 107, or the like. Therefore, in the embodiment, the pixel well voltage Vw1 is fixed to a reference potential Vgnd of, for example, 0V in such a manner that the pixel well voltage Vw1 which is applied to the second impurity diffused portion 109 does not obstruct the operation of the pixel transistor. In the case of using the back gate effect, the pixel well voltage Vw1 may be set to a value other than the reference potential Vgnd.

In such a construction, a diode 113b (refer to FIGS. 12A and 12B, which will be described hereinafter) formed between the first impurity diffused portion 108 and the second impurity diffused portion 109 enters the forwardly biased state. Thus, the electrons cannot be accumulated as signal charges into the N type first impurity diffused portion 108 connected to the node B. Therefore, in the embodiment, the holes are accumulated as signal charges into the first impurity diffused portion 108. In the case of setting the first impurity diffused portion 108 into the P type as illustrated in FIG. 3, the electrons can be also accumulated as signal charges into the first impurity diffused portion 108.

When the accumulation of the holes progresses in the node B connected to the first impurity diffused portion 108, the diode 113b enters the reversely biased state. The embodiment is characterized in that by making the diode 113b cause a Zener breakdown by using the reverse bias, the reversely biased resetting operation is executed. The node B is set into a floating state at timing other than the reset timing.

<Principle of Reversely Biased Reset>

Figure 12A:
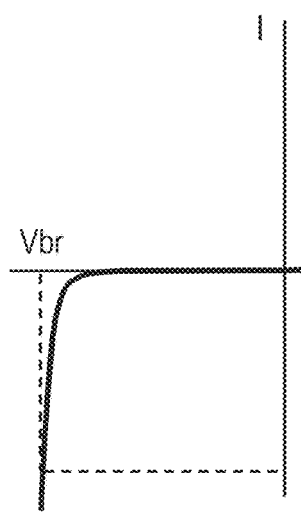
FIGS. 12A and 12B are diagrams for describing a resetting operation by a Zener diode of the photoelectric conversion apparatus according to the second embodiment.
Figure 12B:
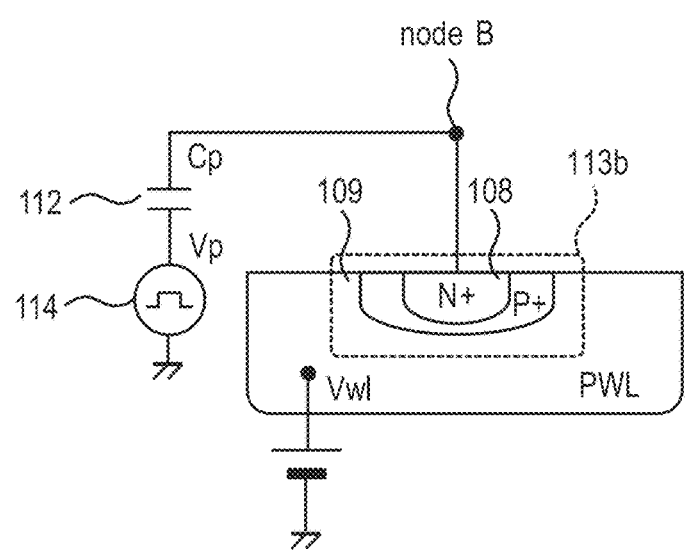

FIGS. 12A and 12B are diagrams for describing the resetting operation by a Zener diode of the photoelectric conversion apparatus according to the second embodiment. FIG. 12A illustrates V-I (voltage-current) characteristics of a Zener diode. FIG. 12B illustrates a construction of a reset switch unit of the pixel 100 using the diode 113b having the V-I characteristics illustrated in FIG. 12A.

As illustrated in FIG. 12B, a P+ type impurity diffused portion 108 is further provided between the N+ type first impurity diffused portion 108 and the P type second impurity diffused portion 109 and a P+ type impurity concentration is optimally designed, thereby forming the diode 113b having the Zener characteristics illustrated in FIG. 12A. In the diode 113b, when a reverse bias of the voltage across its terminals exceeds a Zener breakdown voltage Vbr, a Zener breakdown occurs. A method of executing the reversely biased resetting operation by using such a Zener effect will be described hereinbelow.

When the accumulation of the holes progresses in the node B connected to the first impurity diffused portion 108, the diode 113b enters the reversely biased state. Thus, a voltage across the terminals of the diode 113b becomes a saturation voltage Vsat. When the electric potential Vfd of the node B exceeds the Zener breakdown voltage Vbr, a Zener breakdown occurs. Therefore, the saturation voltage Vsat is equal to the Zener breakdown voltage Vbr at most. A relation between the Zener breakdown voltage Vbr and the saturation voltage Vsat is shown in the following expression (1).

$$Vbr \simeq Vsat \qquad (1)$$

The voltage controlling unit 114 of the embodiment upswings a control voltage Vp by a predetermined voltage difference ΔV from a state where the electric potential Vfd of the node B is equal to the saturation voltage Vsat and applies the electric potential Vfd exceeding the Zener breakdown voltage Vbr to the node B. The electric potential Vfd of the node B after the upswing is shown in the following expression (2).

$$Vfd = Vsat + \Delta V > Vbr \qquad (2)$$

Thus, the diode 113b causes a Zener breakdown, the signal charges accumulated in the node B are drained to the pixel well (PWL) side, and the node B is reset. In this manner, the reversely biased resetting operation is executed. The reversely biased resetting operation is automatically finished when the electric potential Vfd of the node B drops to the Zener breakdown voltage Vbr. For this purpose, it is important that the node B is in the floating state. After that, the voltage controlling unit 114 downswings the control voltage Vp by the predetermined voltage difference ΔV and sets the electric potential Vfd of the node B into the reset voltage Vres of the node B shown in the following equation (3).

$$Vres = Vbr - \Delta V \qquad (3)$$

<Specific Reversely Biased Resetting Operation>

The more specific reversely biased resetting operation will be described. First, the reversely biased resetting operation in the case where the voltage across the terminals of the diode 113b is not set to almost 0V when the node B is reset, that is, in the case where the zero biased resetting operation is not executed will be described. The voltages are set as follows: the pixel well voltage Vw1=Vgnd; the Zener breakdown voltage Vbr=3.0V; and the saturation voltage Vsat=2.5V. It is now assumed that the holes are used as signal charges.

First, the saturation voltage Vsat based on the signal charges accumulated in the node B is read out (S read). Subsequently, the voltage controlling unit 114 upswings the control voltage Vp from 2.5V to 4.0V by the voltage difference ΔV=1.5V and sets the electric potential Vfd of the node B into a reversely biased state larger than the Zener breakdown voltage Vbr.

$$Vfd = Vsat + \Delta V > Vbr \qquad (4)$$
$$= 2.5V + 1.5V$$
$$= 4.0V > 3.0V$$

Thus, the diode 113b causes a Zener breakdown, the signal charges accumulated in the node B are drained to the pixel well (PWL) side, and the node B is reset. The reversely biased resetting operation is automatically finished when the electric potential Vfd of the node B drops to the Zener breakdown voltage Vbr.

Subsequently, the voltage controlling unit 114 downswings the control voltage Vp from 4.0V to 2.5V by the voltage difference ΔV=1.5V.

$$Vfd = Vbr - \Delta V \qquad (5)$$
$$= 3.0V - 1.5V = 1.5V$$

Thus, the electric potential Vfd of the node B is set to 1.5V. This value becomes the reset voltage Vres in the reversely biased resetting operation. After that, the reference signal N based on the signal charges accumulated in the node B after the reset is read out (N read). If the voltage difference ΔV of the downswing in the reversely biased resetting operation is too large, there is such a risk that the diode 113b enters the forwardly biased state. In this case, the electric potential Vfd of the node B is set to the pixel well voltage Vw1=Vgnd and is out of the operation range of the amplification transistor 106, and the signal read-out upon resetting cannot be performed. Therefore, it is necessary to pay an attention to the control of the voltage difference ΔV at the time of the downswing.

Subsequently, the reversely biased resetting operation in the case where the voltage across the terminals of the diode 113b is set to almost 0V when the node B is reset, that is, in the case where the zero biased resetting operation is executed will be described. The voltages are set as follows: the pixel well voltage Vw1=Vgnd; the Zener breakdown voltage Vbr=3.0V; and the saturation voltage Vsat=1.0V. It is now assumed that the holes are used as signal charges.

First, the voltage controlling unit 114 upswings the control voltage Vp from 0V to 1.5V by a voltage difference $\Delta V0=1.5V$ and returns the electric potential Vfd of the node B to the operation range of the amplification transistor 106. Subsequently, the pixel signal based on the signal charges accumulated in the node B is read out (S read).

$$Vfd = Vsat + \Delta V0 \quad (6)$$
$$= 1.0V + 1.5V = 2.5V$$

Subsequently, the voltage controlling unit 114 further upswings the control voltage Vp from 1.5V to 4.0V by a voltage difference $\Delta V1=2.5V$ and sets the electric potential Vfd of the node B into the reversely biased state larger than the Zener breakdown voltage Vbr.

$$Vfd = 2.5V + \Delta V1 > Vbr \quad (7)$$
$$= 2.5V + 2.5V$$
$$= 5.0V > 3.0V$$

Thus, the diode 113b causes a Zener breakdown, the signal charges accumulated in the node B are drained to the pixel well (PWL) side, and the node B is reset. The reversely biased resetting operation is automatically finished when the electric potential Vfd of the node B drops to the Zener breakdown voltage Vbr. After that, the voltage controlling unit 114 downswings the control voltage Vp from 4.0V to 2.5V by a voltage difference $\Delta V2=1.5V$.

$$Vfd = Vbr - \Delta V2 \quad (8)$$
$$= 3.0V - 1.5V = 1.5V$$

In this state, the reference signal N based on the signal charges accumulated in the node B after the reset is read out (N read). Subsequently, the voltage controlling unit 114 further downswings the control voltage Vp from 2.5V to 0V by a voltage difference $\Delta V3=2.5V$.

$$Vfd = 1.5V - \Delta V3 \quad (9)$$
$$= 1.5V - 2.5V$$
$$= -1.0V$$

Thus, the diode 113b enters the forwardly biased state and the electric potential Vfd of the node B is again set to Vpw1=Vgnd. That is, it is set to a zero bias. After that, the accumulation of the signal charges is started again.

As mentioned above, in the embodiment, by controlling the electric potential of the second electrode layer (node B) of the photoelectric conversion unit through the bias controlling capacitor, the voltage across the terminals of the diode is controlled. Even by such a construction, an effect similar to that of the first embodiment can be obtained. After the diode was made to cause the Zener breakdown by upswinging the electric potential of the second electrode layer (node B), by setting the diode into the forwardly biased state, the reversely biased resetting operation can be executed.

Particularly, in the embodiment, even in the case where the pixel well containing the second impurity diffused portion 109 is shared by a plurality of pixels 100 as described in the modification illustrated in FIG. 8, the voltage across the terminals of the diode 113b can be controlled every pixel 100. Thus, since the resetting operation can be executed every pixel 100, the rolling shutter operation can be executed without increasing the pixel size.

Third Embodiment

<CDS Circuit in Pixel>

Figure 13:
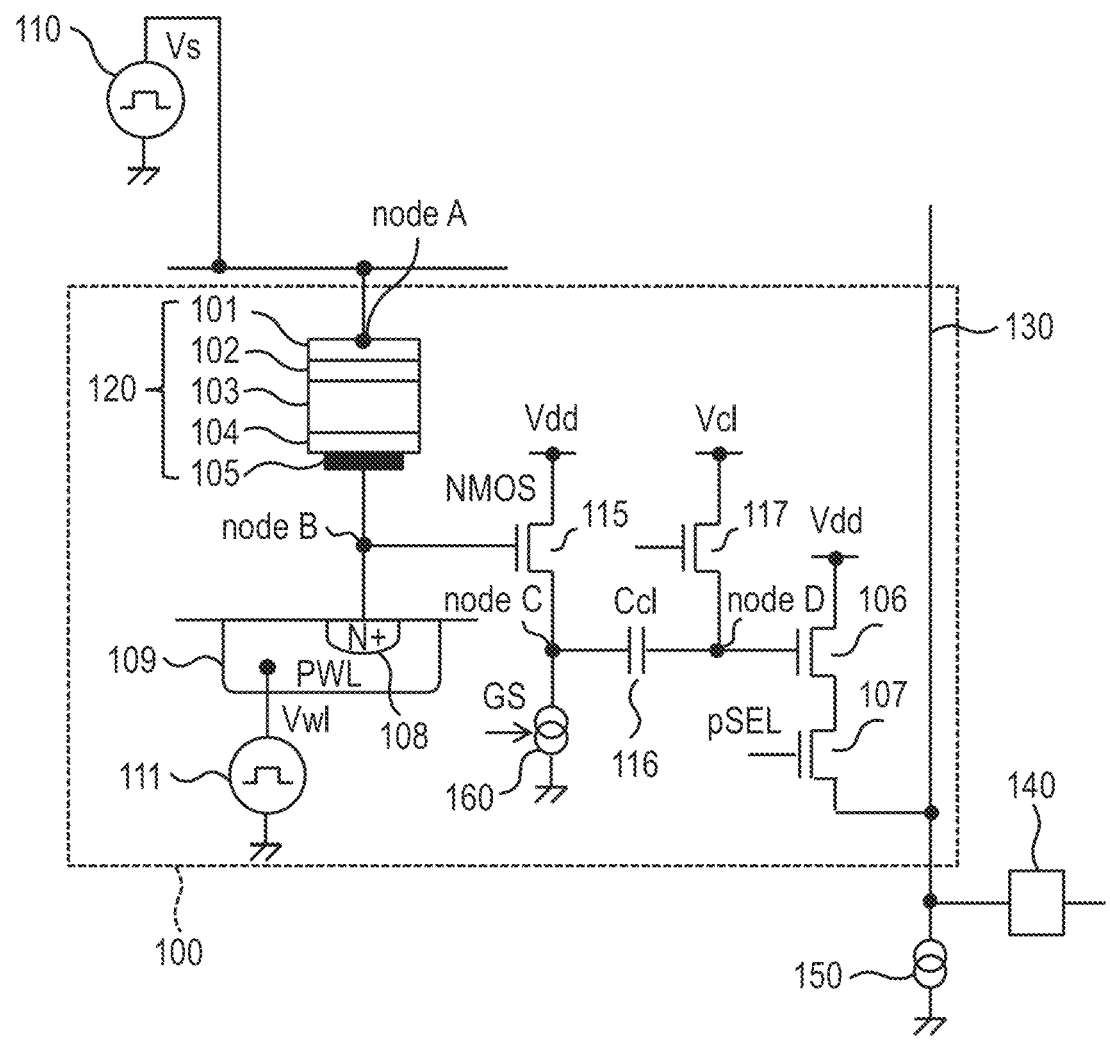
FIG. 13 is a diagram schematically illustrating a construction of a pixel of a photoelectric conversion apparatus according to the third embodiment.

FIG. 13 is a diagram schematically illustrating a construction of the pixel 100 of a photoelectric conversion apparatus according to the third embodiment. Component elements having the same functions as those in FIG. 1 are designated by the same reference numerals. The pixel 100 of the embodiment illustrated in FIG. 13 has a clamping capacitor 116 of a capacitance Cc1. One end of the clamping capacitor 116 is connected to an output side of an amplification transistor 115. The other end of the clamping capacitor 116 is connected to the gate electrode of the amplification transistor 106 at the post stage through a node D. A clamping voltage Vc1 is supplied to the node D through a clamping transistor 117. According to such a construction, a CDS (Correlated Double Sampling) can be executed in the pixel 100 by a construction having a clamping circuit.

As mentioned above, the pixel 100 of the embodiment has a first amplification unit (amplification transistor 115) for amplifying the signal based on the signal charges accumulated in the second electrode layer (node B) of the photoelectric conversion unit. The pixel 100 also has a second amplification unit (amplification transistor 106) provided at the post stage of the first amplification unit. According to such a construction, even if the clamping circuit is formed in the pixel 100, since the reset transistor can be omitted, the CDS can be executed in the pixel 100 while suppressing an increase in pixel size.

Figure 14:
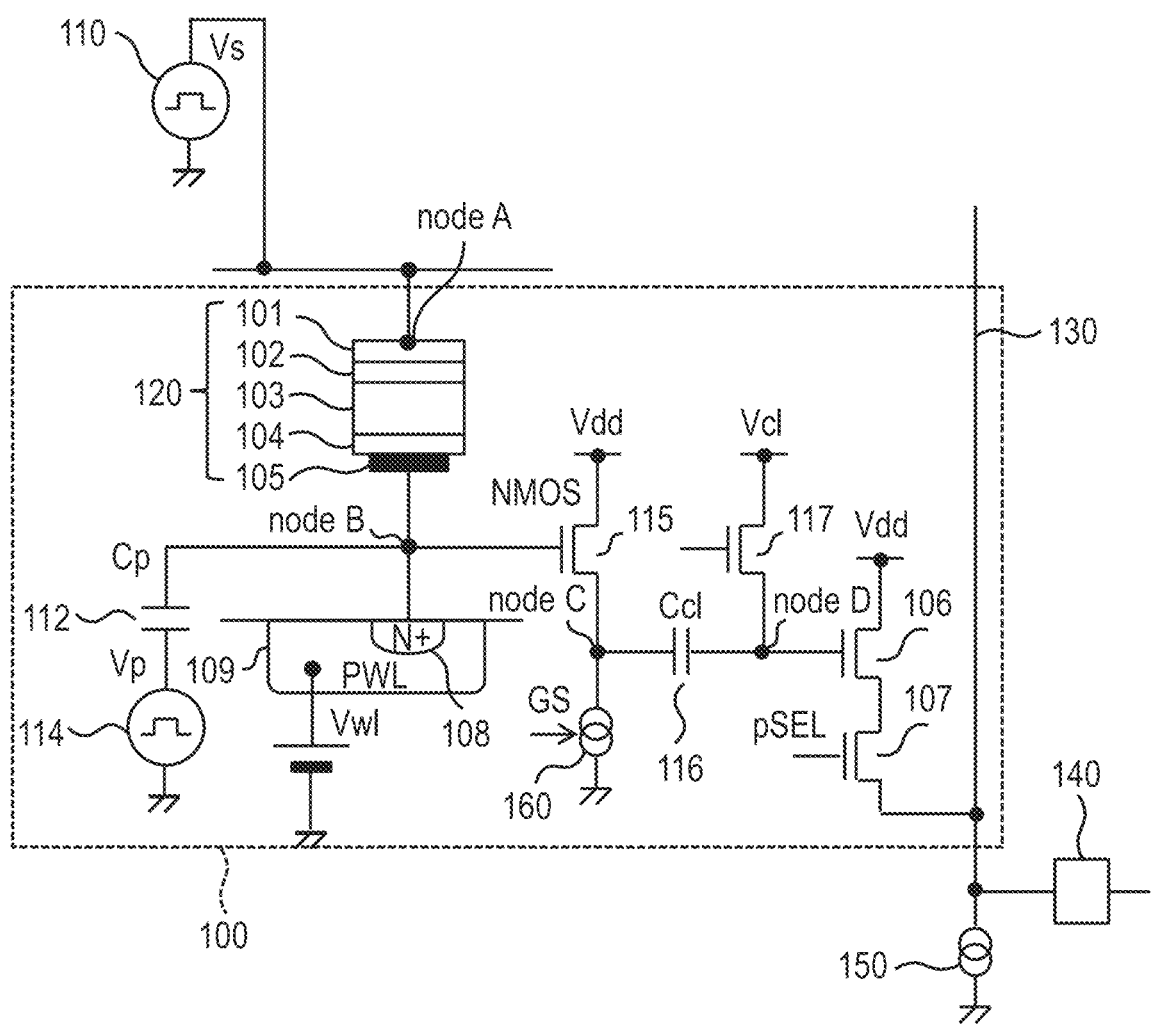
FIG. 14 is a diagram illustrating a modification of the construction of the pixel illustrated in FIG. 13.

FIG. 14 is a diagram illustrating a modification of the construction of the pixel 100 illustrated in FIG. 13. FIG. 14 is the diagram obtained by applying the construction of the foregoing second embodiment to the construction illustrated in FIG. 13. According to such a construction, even if the pixel well including the second impurity diffused portion 109 is shared by a plurality of pixels 100, the voltage across the terminals of the diode can be controlled every pixel 100. Thus, since the resetting operation can be executed every pixel 100, the rolling shutter operation can be executed without increasing the pixel size.

Fourth Embodiment

<CDS Circuit in Pixel>

Figure 15:
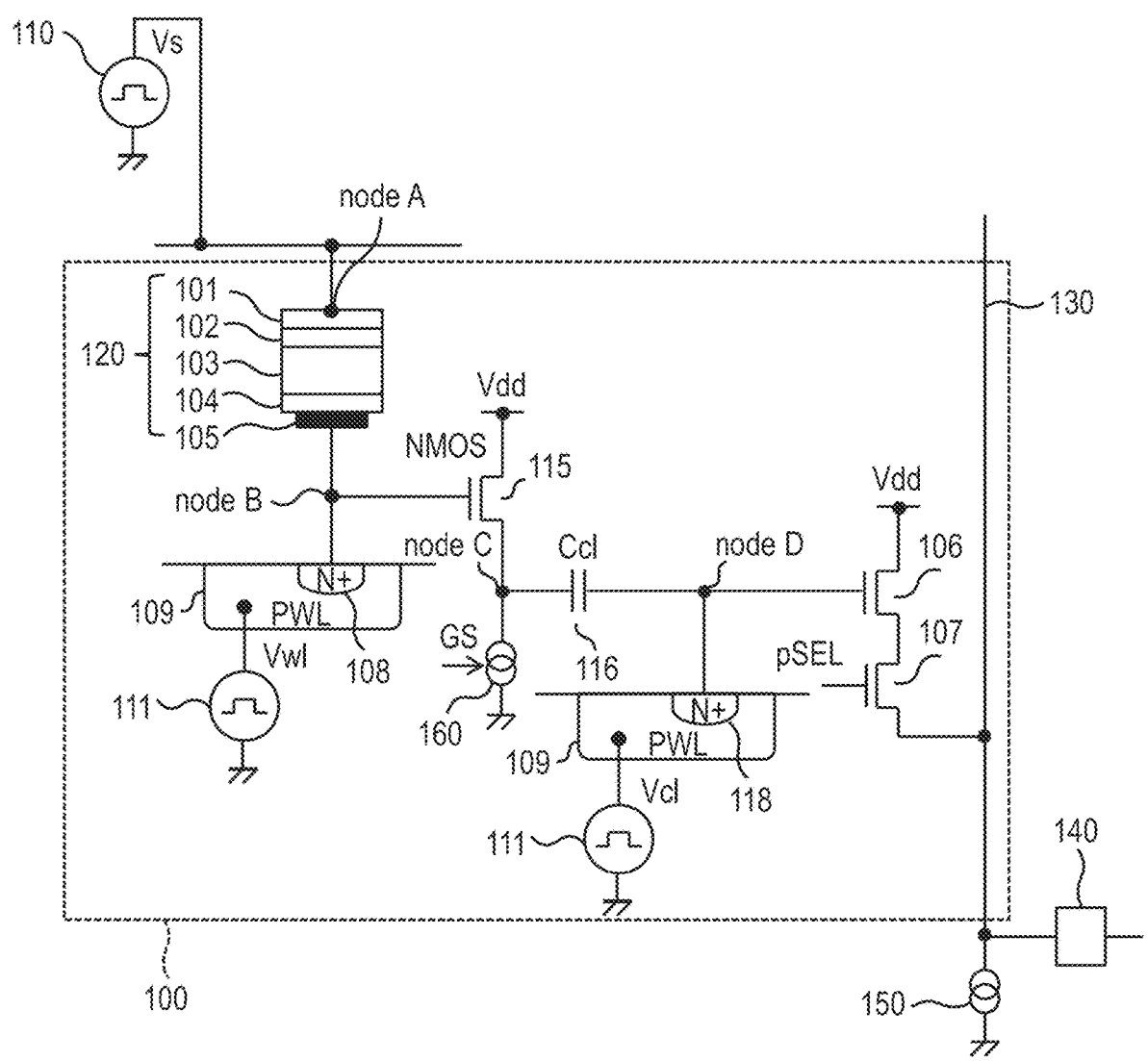
FIG. 15 is a diagram schematically illustrating a construction of a pixel of a photoelectric conversion apparatus according to the fourth embodiment.

FIG. 15 is a diagram schematically illustrating a construction of the pixel 100 of a photoelectric conversion apparatus according to the fourth embodiment. Component elements having the same functions as those in FIG. 13 are designated by the same reference numerals. The pixel 100 of the embodiment illustrated in FIG. 15 has a second diode including a PN junction portion formed by a third impurity diffused portion 118 and the second impurity diffused portion 109 in place of the construction in which the clamping transistor 117 existing in FIG. 13 is omitted.

The third impurity diffused portion 118 is formed in the second impurity diffused portion 109 and is connected to the node D. The clamping voltage Vc1 is supplied to the node D through the second diode. The voltage controlling unit 111 of the embodiment is connected to the second impurity diffused portion 109 and is characterized by controlling the voltage across the terminals of the second diode and supplying the clamping voltage Vc1 to the node D.

As mentioned above, the pixel 100 of the embodiment has the second diode connected to the node D between the first amplification unit (amplification transistor 115) and the second amplification unit (amplification transistor 106). The controlling unit of the embodiment controls the voltage across the terminals of the second diode and controls the voltage of the node D.

According to such a construction, the second diode formed by the third impurity diffused portion 118 and the second impurity diffused portion 109 is combined with the voltage controlling unit 111 and functions as a switch for supplying the clamping voltage Vc1 to the node D. Since a region of the third impurity diffused portion 118 can be formed in a very small size, the clamping circuit of the pixel 100 can be formed in a small size onto the semiconductor substrate. Thus, since the clamping transistor 117 can be omitted, the CDS can be executed in the pixel 100 while suppressing an increase in pixel size.

Figure 16:
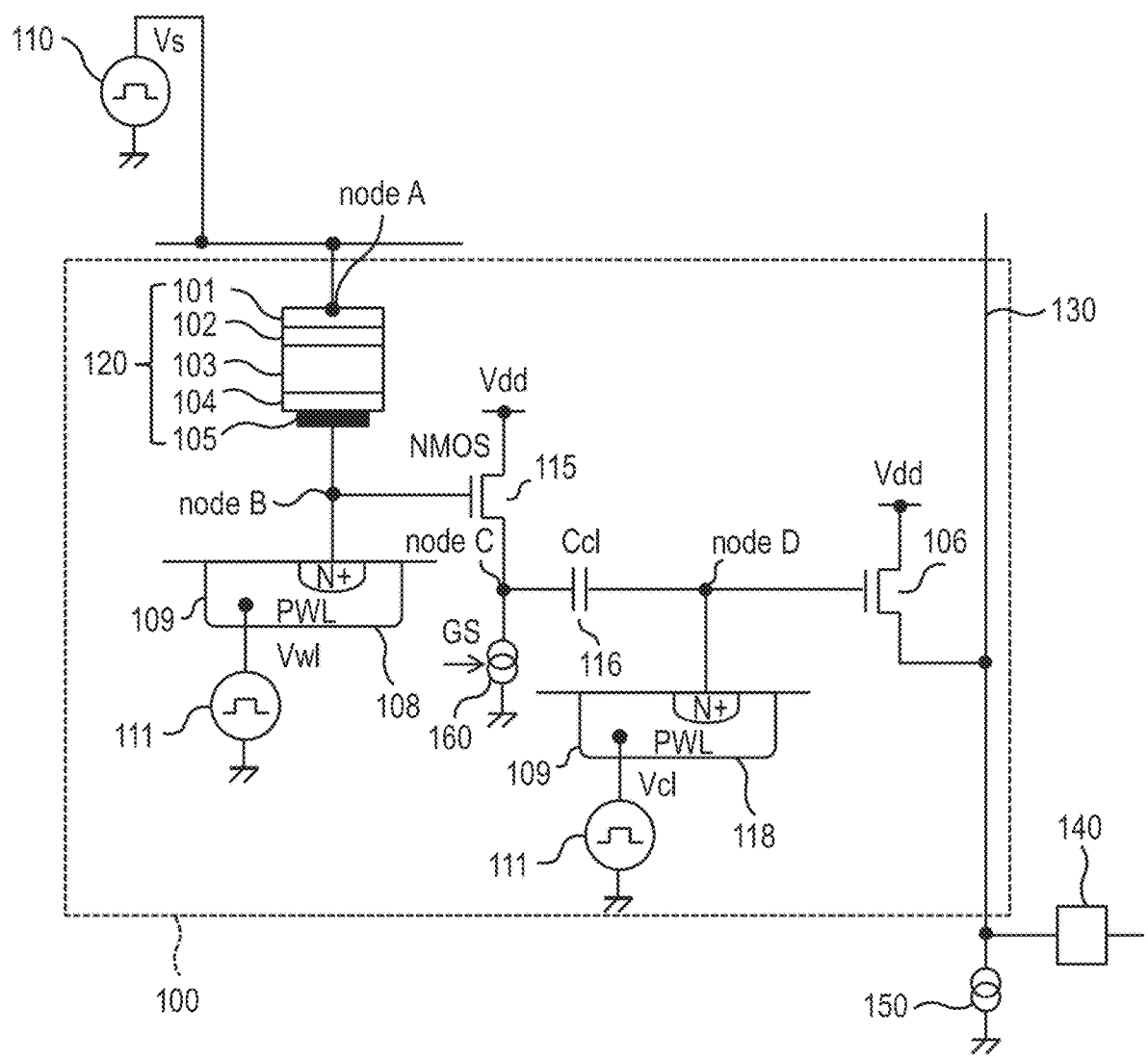
FIG. 16 is a diagram illustrating a modification of the construction of the pixel illustrated in FIG. 15.

FIG. 16 is a diagram illustrating a modification of the construction of the pixel 100 illustrated in FIG. 15. In the modification illustrated in FIG. 16, the rows are selection controlled by controlling the voltage of the node D in place of such a construction that the selection transistor 107 existing in FIG. 15 is omitted. According to such a construction, since the selection transistor 107 can be omitted, even if the CDS circuit is provided in the pixel, an increase in pixel size can be suppressed.

Figure 17:
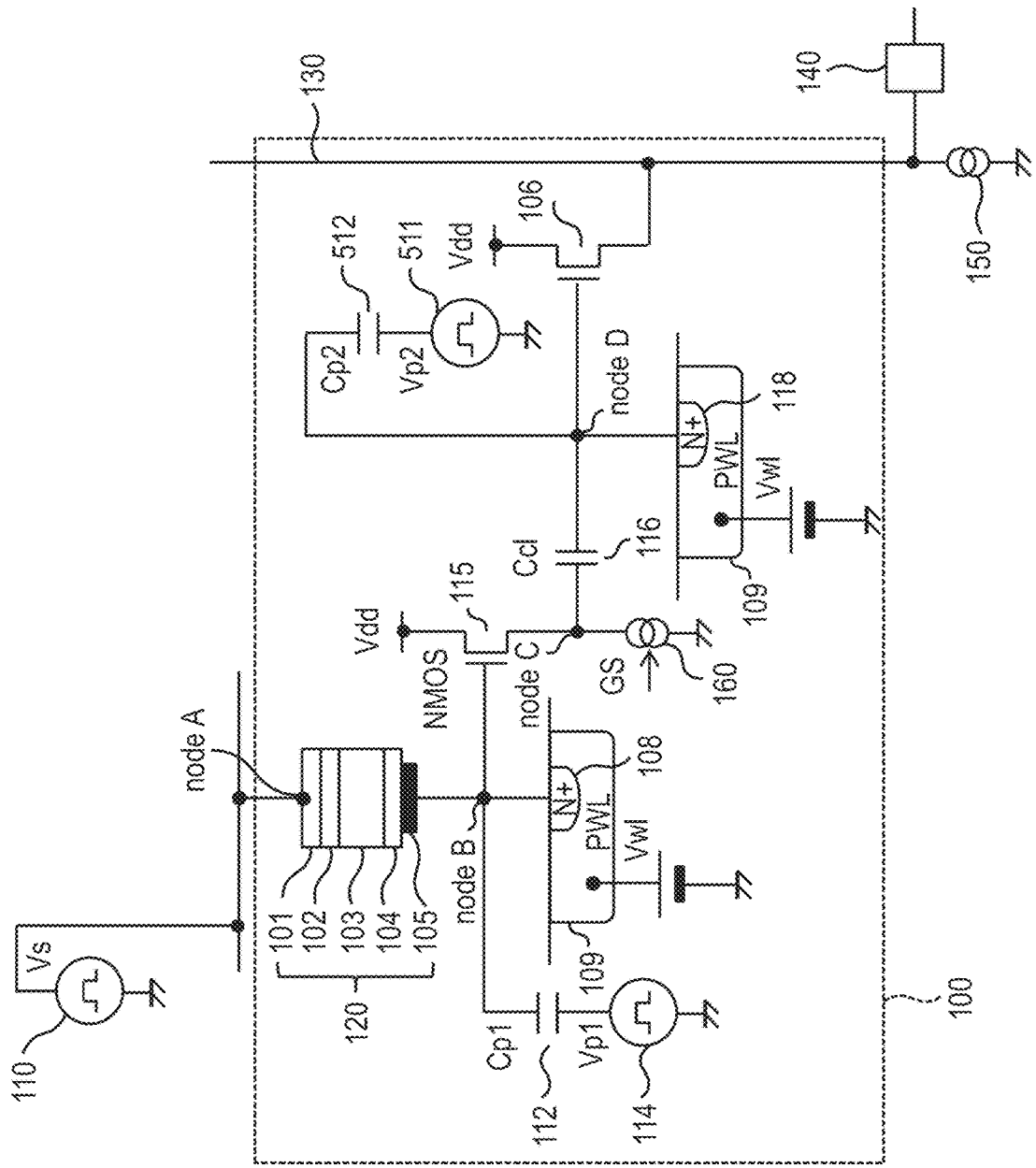
FIG. 17 is a diagram illustrating a modification of the construction of the pixel illustrated in FIG. 16.

FIG. 17 is a diagram illustrating a modification of the construction of the pixel 100 illustrated in FIG. 16. FIG. 17 is the diagram obtained by applying the construction of the foregoing second embodiment to the construction illustrated in FIG. 16. The voltage controlling unit 114 controls the electric potential of the node B through the bias controlling capacitor 112 of a capacitance Cp1. A voltage controlling unit 511 controls the voltage of the second node (node D) through a second bias controlling capacitor 512 of a capacitance Cp2.

According to such a construction, even if the pixel well including the second impurity diffused portion 109 is shared by a plurality of pixels 100, the voltage across the terminals of the second diode can be controlled every pixel 100. Thus, since the resetting operation and the CDS can be executed every pixel 100, the rolling shutter operation can be executed without increasing the pixel size. The voltage controlling unit 114 and the voltage controlling unit 511 may be united into one unit.

Fifth Embodiment

Figure 18:
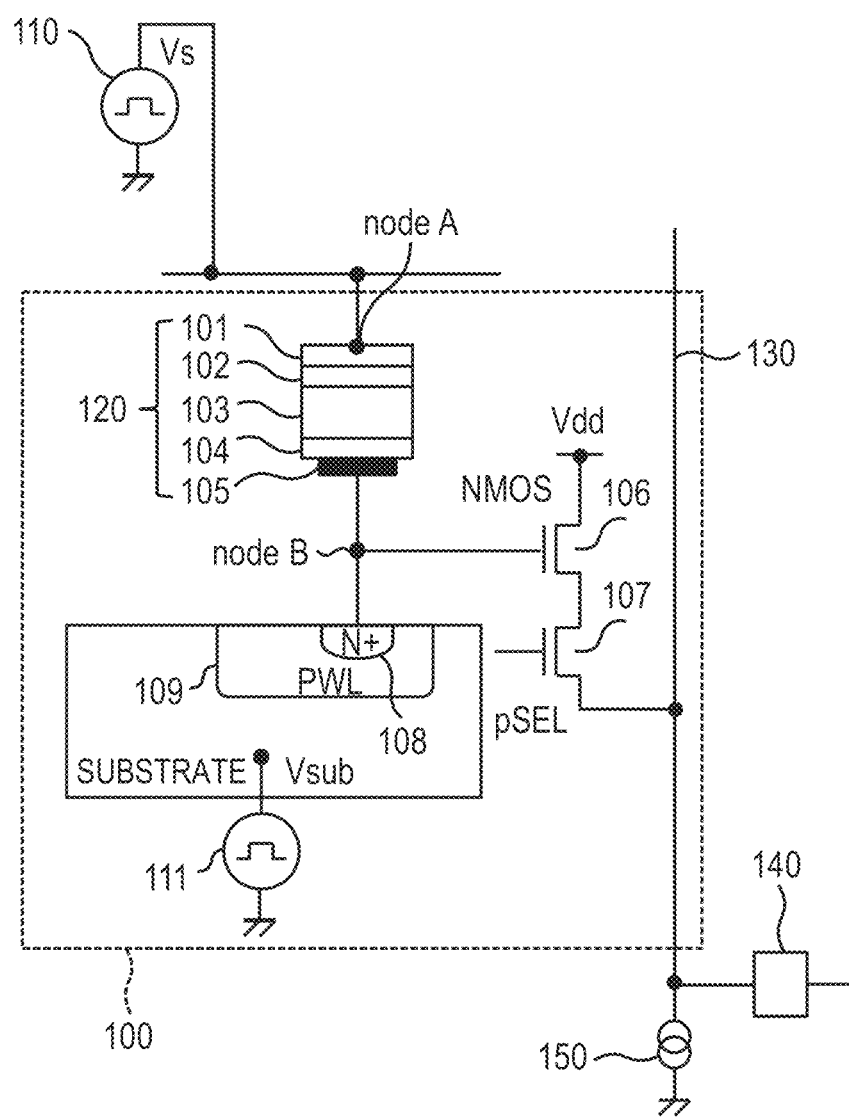
FIG. 18 is a diagram schematically illustrating a construction of a pixel of a photoelectric conversion apparatus according to the fifth embodiment.

<Vertical Overflow Drain Structure>
FIG. 18 is a diagram schematically illustrating a construction of the pixel 100 of a photoelectric conversion apparatus according to the fifth embodiment. Component elements having the same functions as those in FIG. 1 are designated by the same reference numerals. A diode of the embodiment illustrated in FIG. 18 has a VOD (Vertical Overflow Drain) structure formed by the first impurity diffused portion 108, the second impurity diffused portion 109, and a semiconductor substrate.

The voltage controlling unit 111 of the embodiment swings a voltage Vsub on the substrate side and resets the signal charges accumulated in the second electrode (node B) by using a punch through phenomenon in an NPN junction portion. The NPN junction portion may be formed by using double pixel wells.

Even by such a construction, since the reset transistor can be omitted, an increase in pixel size can be suppressed in a manner similar to the first embodiment. Particularly, as compared with the case of using the diode characteristics of the first embodiment, there is also such an effect that no reset noises are generated according to the reset using the punch through phenomenon.

Sixth Embodiment

Figure 19:
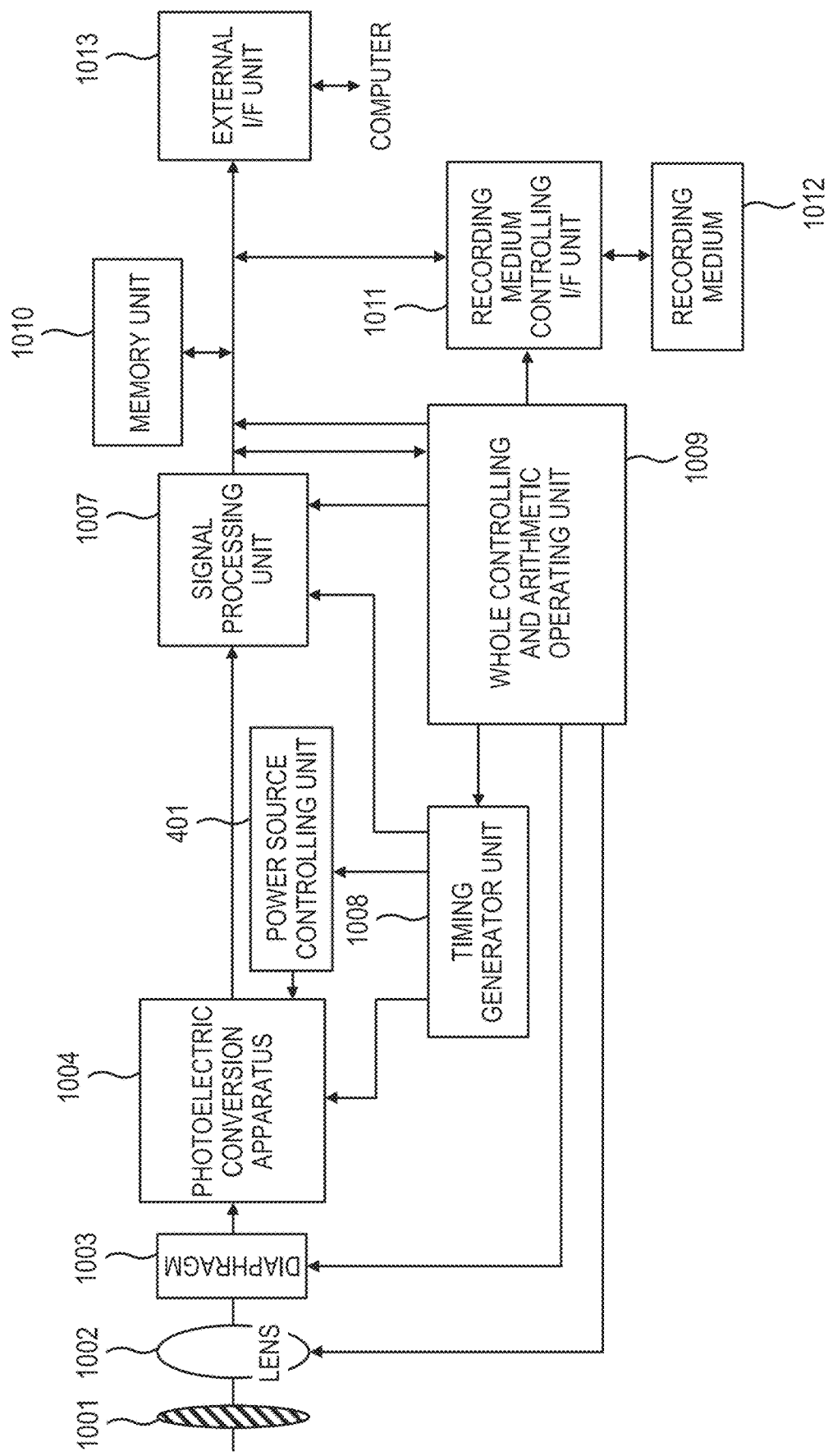
FIG. 19 is a diagram schematically illustrating a construction of an imaging system according to the sixth embodiment.

<Imaging System>
Subsequently, an example of an imaging system to which a photoelectric conversion apparatus 1004 described in each of the foregoing embodiments is applied will be described. As such an imaging system, a digital still camera, a digital camcorder, a camera head, a copying apparatus, a facsimile apparatus, a cellular phone, an on-vehicle camera, an observation satellite, or the like can be mentioned. FIG. 19 is a diagram schematically illustrating a construction of an imaging system according to the sixth embodiment. As an example of the imaging system, a block diagram of a digital still camera is illustrated in FIG. 19.

A barrier 1001 protects a lens 1002. The lens 1002 focuses an optical image of an object onto the photoelectric conversion apparatus 1004. A diaphragm 1003 varies an amount of light passing through the lens 1002. The photoelectric conversion apparatus 1004 has the construction described in each of the foregoing embodiments, photographs the optical image focused by the lens 1002, and obtains image data. The A/D conversion unit 204 and the like are formed on the semiconductor substrate of the photoelectric conversion apparatus 1004.

An image processing unit 1007 executes various kinds of processes such as correction and compression to the image data obtained by the photoelectric conversion apparatus 1004. A timing generator unit 1008 outputs various kinds of timing signals to the photoelectric conversion apparatus 1004 and the image processing unit 1007. A whole controlling and arithmetic operating unit 1009 controls the whole digital still camera. A memory unit 1010 temporarily stores the image data. A recording medium controlling I/F unit 1011 is an interface for recording or reading out the image data into/from a recording medium 1012. The recording medium 1012 is a detachable semiconductor memory or the like for recording or reading out the image data. An external I/F unit 1013 is an interface for communicating with an external computer or the like.

The power source controlling unit 401 includes the voltage controlling units 110 and 111 illustrated in FIG. 1. The photoelectric conversion apparatus 1004 may be constructed so as to include the power source controlling unit 401. It is sufficient that the imaging system of the embodiment has a signal processing apparatus (image processing unit 1007) for processing an imaging signal which was output from the photoelectric conversion apparatus 1004 and the photoelectric conversion apparatus 1004. The timing signal or the like may be input from the outside of the imaging system.

In the imaging system of the embodiment, the electrode voltage Vs which is supplied to the pixel 100 is adjusted in accordance with an exposing condition such as automatic exposure, manual exposure, or the like. Thus, optimum shutter bias condition can be set in accordance with a photographing scene.

In the embodiment, the photoelectric conversion apparatus 1004 and the A/D conversion unit 204 may be arranged on the same semiconductor substrate or may be arranged on the different semiconductor substrates. The photoelectric conversion apparatus 1004 and the image processing unit 1007 may be arranged on the same semiconductor substrate or may be arranged on the different semiconductor substrates.

Each pixel 100 may be constructed so as to include a first photoelectric conversion unit 120A and a second photoelectric conversion unit 120B. The image processing unit 1007 may be constructed so as to process the signal based on the signal charges generated in the first photoelectric conversion unit 120A and the signal based on the signal charges generated in the second photoelectric conversion unit 120B and obtain information of a distance from the photoelectric conversion apparatus 1004 to the object.

As mentioned above, the imaging system of the embodiment has the photoelectric conversion apparatus 1004 of the foregoing embodiment and the image processing unit 1007 for processing the imaging signal which was output from the photoelectric conversion apparatus 1004. According to such a construction, an image in which the noises were reduced can be obtained.

Seventh Embodiment

Figure 20A:
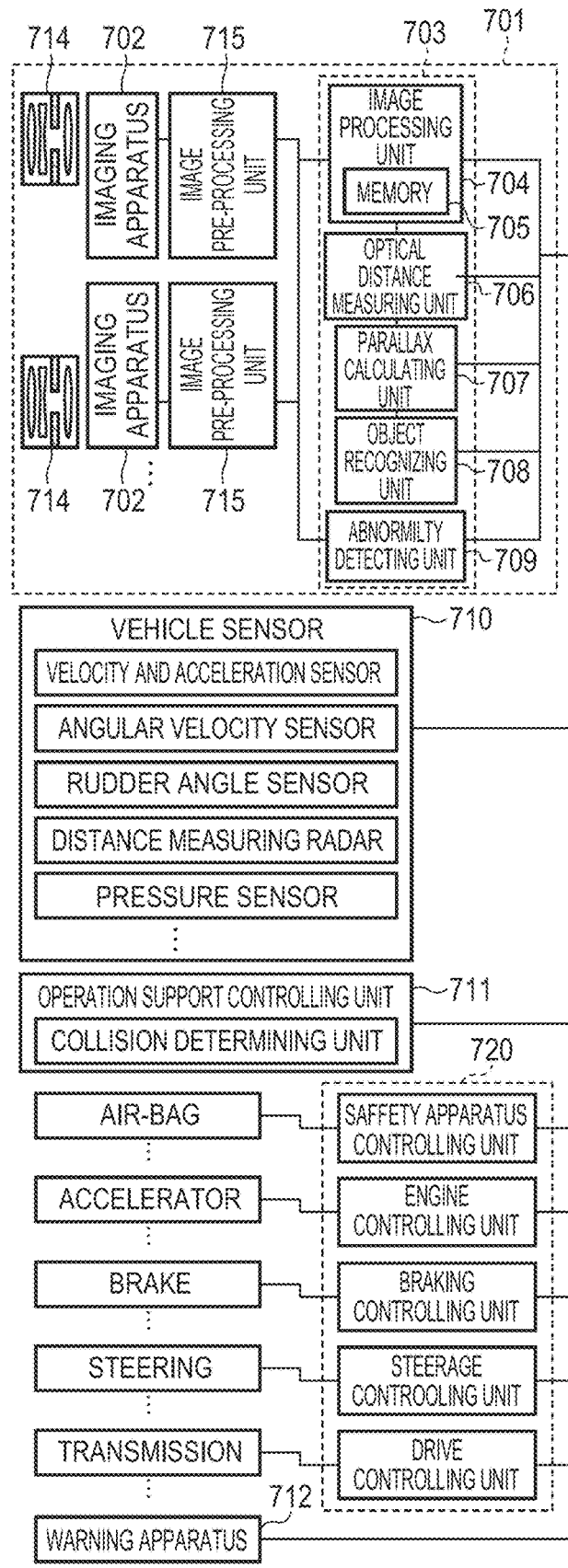
FIGS. 20A and 20B are schematic diagrams illustrating an example of a construction of an imaging system and a moving vehicle according to the seventh embodiment.
Figure 20B:
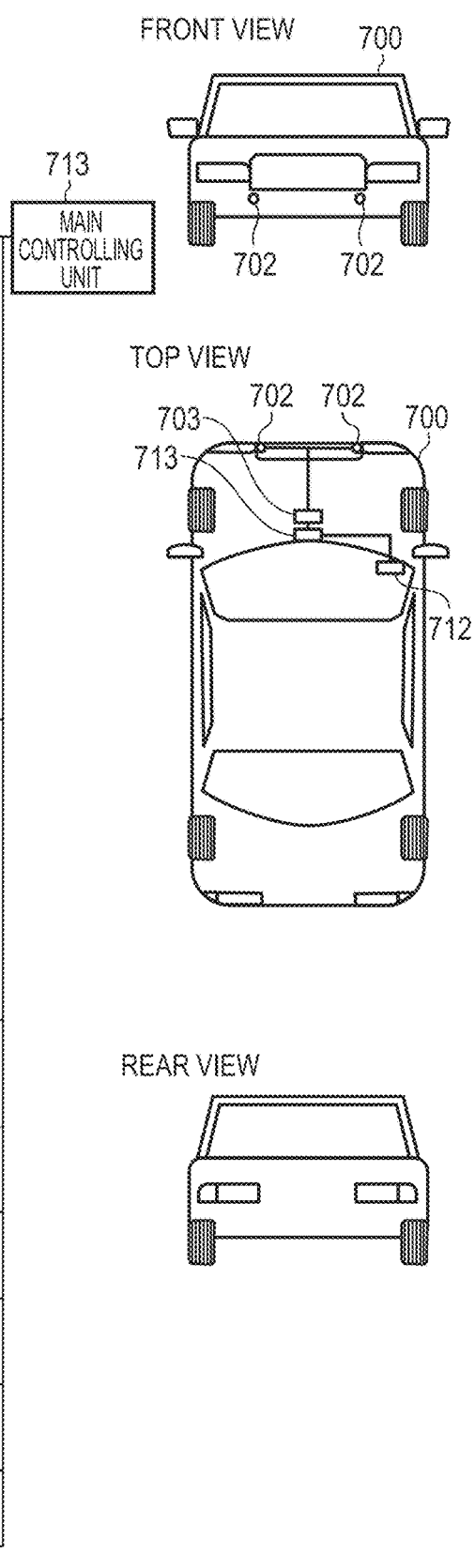

Subsequently, an imaging system and a moving vehicle according to the seventh embodiment will be described with reference to FIGS. 20A and 20B. FIGS. 20A and 20B are schematic diagrams illustrating an example of a construction of the imaging system and the moving vehicle according to the seventh embodiment.

In the embodiment, an example of the imaging system regarding an on-vehicle camera is illustrated. FIG. 20A illustrates an example of a vehicle system and the imaging system mounted therein. An imaging system 701 includes imaging apparatuses 702, image pre-processing units 715, an integrated circuit 703, and optical systems 714. The optical system 714 focuses an optical image of an object onto the imaging apparatus 702. The imaging apparatus 702 converts the optical image of the object focused by the optical system 714 into an electric signal. The imaging apparatus 702 is an imaging apparatus having the photoelectric conversion apparatus of any one of the foregoing embodiments. The image pre-processing unit 715 executes predetermined signal processes to the signal which was output from the imaging apparatus 702. A function of the image pre-processing unit 715 may be assembled in the imaging apparatus 702. At least two sets each comprising the optical system 714, imaging apparatus 702, and image pre-processing unit 715 are provided for the imaging system 701. An output from the image pre-processing unit 715 of each set is input to the integrated circuit 703.

The integrated circuit 703 is an integrated circuit for use in the imaging system and includes: an image processing unit 704 including a memory 705; an optical distance measuring unit 706; a parallax calculating unit 707; an object recognizing unit 708; and an abnormality detecting unit 709. The image processing unit 704 executes a developing process and image processes such as a defect correction and the like to an output signal of the image pre-processing unit 715. The memory 705 temporarily stores the photographed image and stores a defect position of the photographed image. The optical distance measuring unit 706 performs an in-focus process and a distance measurement of the object. The parallax calculating unit 707 calculates a parallax (phase difference of a parallax image) from a plurality of image data obtained by a plurality of imaging apparatuses 702. The object recognizing unit 708 recognizes the object such as car, road, signpost, human, or the like. When the abnormality detecting unit 709 detects an abnormality of the imaging apparatus 702, it informs a main controlling unit 713 of the abnormality.

The integrated circuit 703 may be realized by dedicated designed hardware, may be realized by a software module, or may be realized by a combination of them. The integrated circuit 703 may be realized by an FPGA (Field Programmable Gate Array), an ASIC (Application Specific Integrated Circuit), or the like or may be realized by a combination of them.

The main controlling unit 713 supervises and controls the operations of the imaging system 701, a vehicle sensor 710, a controlling unit 720, and the like. It is not always necessary to have the main controlling unit 713 but the apparatus can also use a method whereby the imaging system 701, vehicle sensor 710, and controlling unit 720 individually have communication interfaces and each of them performs a transmission and a reception of a control signal through a communication network (for example, CAN standard).

The integrated circuit 703 has a function for receiving the control signal from the main controlling unit 713 or transmitting a control signal or setting values to the imaging apparatus 702 by its own controlling unit. For example, the integrated circuit 703 transmits a setting value for pulse driving a voltage switch in the imaging apparatus 702, a setting value for changing over the voltage switch every frame, or the like.

The imaging system 701 is connected to the vehicle sensor 710 and can detect a running state of its own vehicle such as vehicle speed, yaw rate, rudder angle, and the like, an environment out of the own vehicle, and states of other vehicles and obstacles. The vehicle sensor 710 is also distance information obtaining means for obtaining information of a distance from the parallax image to the object. The imaging system 701 is connected to an operation support controlling unit 711 for performing various kinds of operation supports such as steerage, cruise, collision preventing function, and the like. Particularly, with respect to a collision determining function, an estimation of a collision with other vehicles and obstacles and the presence or absence of a collision are determined on the basis of detection results of the imaging system 701 and the vehicle sensor 710. Thus, avoidance control in the case where a collision is estimated and an activation of a safety apparatus at the time of collision are performed.

The imaging system 701 is also connected to a warning apparatus 712 for generating a warning to the driver on the basis of a determination result of a collision determining unit. For example, if a collision possibility is high as a determination result of the collision determining unit, the main controlling unit 713 makes vehicle control such as collision avoidance or damage reduction by braking, returning an accelerator, suppressing an engine power, or the like. The warning apparatus 712 gives a warning to the user by sounding an alarm such as a sound or the like, displaying warning information to a displaying unit of a car navigation system, meter panel, or the like, giving a vibration to a seat belt or a steering, or the like.

In the embodiment, a region around a vehicle 700, for example, a forward or rearward region is photographed by the imaging system 701. FIG. 20B illustrates an example of a layout of the imaging system 701 in the case of photographing the forward region of the vehicle by the imaging system 701.

The two imaging apparatuses 702 are arranged at front positions of the vehicle 700. Specifically speaking, if a forward/backward moving azimuth of the vehicle 700 or a center line to an external shape (for example, vehicle width) is regarded as an axis of symmetry and the two imaging apparatuses 702 are line-symmetrically arranged with respect to the axis of symmetry, such a layout is desirable when the information of the distance between the vehicle 700 and the object to be photographed is obtained or a collision possibility is determined. It is also desirable that the imaging apparatuses 702 are arranged at such positions that a field of view of the driver is not obstructed when the driver visually confirms an external situation of the vehicle 700 from the driving seat. It is desirable that the warning apparatus 712 is arranged at such a position that it is liable to enter the field of view of the driver.

The foregoing embodiments are merely shown as specific examples when embodying the present invention and a technical scope of the invention is not limitedly interpreted by those embodiments. That is, the invention can be embodied in various forms without departing from its technical idea or its principal feature. For example, the constructions of the foregoing embodiments can be applied by combining them.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-098194, filed May 17, 2017, which is hereby incorporated by reference herein in its entirety.

What is claimed is:

1. A photoelectric conversion apparatus comprising a semiconductor substrate, a plurality of pixels, and a controlling unit, wherein:
   each of the plurality of pixels has a photoelectric conversion unit and a diode;
   the photoelectric conversion unit has:
   a first electrode layer,
   a second electrode layer provided between the first electrode layer and the semiconductor substrate, and
   a photoelectric conversion layer provided between the first electrode layer and the second electrode layer, wherein:
   the diode has a first impurity diffused portion of a first conductivity type and a second impurity diffused portion of a second conductivity type, the first impurity diffused portion and the second impurity diffused portion being configured to form a PN junction, the first impurity diffused portion being formed in the second impurity diffused portion;
   the second electrode layer is connected to the first impurity diffused portion,
   the controlling unit applies a voltage adapted to set the diode into a forwardly biased state and a voltage adapted to set the diode into a reversely biased state, to the diode, respectively, to the second impurity diffused portion, and
   the diode in the forwardly biased state, resets charges accumulated in the second electrode layer.

2. An apparatus according to claim 1, wherein:
   the second impurity diffused portion is a well region formed on the semiconductor substrate; and
   the first impurity diffused portion is formed in the well region.

3. An apparatus according to claim 2, wherein the well region is shared by the plurality of pixels.

4. An apparatus according to claim 2, wherein:
   the diode has a vertical overflow drain structure formed by the first impurity diffused portion, the second impurity diffused portion, and the semiconductor substrate; and
   the controlling unit is connected to the semiconductor substrate and resets signal charges accumulated in the second electrode layer by setting the diode into the forwardly biased state.

5. An apparatus according to claim 2, wherein the controlling unit is connected to the second electrode layer through a bias controlling capacitor and controls an electric potential of the second electrode layer through the bias controlling capacitor.

6. An apparatus according to claim 2, further comprising a first amplification unit configured to amplify a signal based on signal charges accumulated in the second electrode layer.

7. An apparatus according to claim 6,
   wherein the first amplification unit comprises a transistor having a gate connected to the second electrode layer and the first impurity region, and
   the diode in the forwardly biased state, resets charges accumulated in the second electrode layer and the gate.

8. An imaging system comprising:
   the photoelectric conversion apparatus according to claim 1; and
   a signal processing apparatus for processing an imaging signal which is output from the photoelectric conversion apparatus.

9. A moving vehicle comprising:
   an imaging apparatus having the photoelectric conversion apparatus according to claim 1;
   a signal processing unit configured to process a signal based on signal charges generated in a first photoelectric conversion unit of the photoelectric conversion apparatus and a signal based on signal charges generated in a second photoelectric conversion unit and obtain information of a distance to an object; and
   a main controlling unit configured to control the moving vehicle on the basis of the distance information.

10. A photoelectric conversion apparatus comprising a semiconductor substrate, a plurality of pixels, and a controlling unit, wherein:
    each of the plurality of pixels has a photoelectric conversion unit and a diode;
    the photoelectric conversion unit has:
    a first electrode layer,
    a second electrode layer provided between the first electrode layer and the semiconductor substrate, and
    a photoelectric conversion layer provided between the first electrode layer and the second electrode layer,
    wherein:
    the diode has a first impurity diffused portion of a first conductivity type and a second impurity diffused portion of a second conductivity type,
    the second electrode layer is connected to the first impurity diffused portion,
    the controlling unit applies a voltage adapted to set the diode into a forwardly biased state and a voltage adapted to set the diode into a reversely biased state, to the diode, respectively, and
the diode in the forwardly biased state, resets charges accumulated in the second electrode layer,
the diode has a PN junction portion formed by the first impurity diffused portion and the second impurity diffused portion;
the second impurity diffused portion is a well region formed on the semiconductor substrate; and
the first impurity diffused portion is formed in the well region,
wherein the pixel further has:
a first amplification unit configured to amplify a signal based on signal charged accumulated in the second electrode layer; and,
wherein:
a second amplification unit connected to a post stage of the first amplification unit through a clamping capacitor and a node and a second diode connected to the node; and wherein:
the controlling unit controls a voltage across terminals of the second diode and supplies a clamping voltage to the node,
the second diode has a PN junction portion formed by a third impurity diffused portion of the first conductivity type and the second impurity diffused portion; and
the third impurity diffused portion is formed in the well region and is connected to the node.

11. An apparatus according to claim 10, wherein the controlling unit is connected to the second impurity diffused portion and controls an electric potential of the node by setting the second diode into the forwardly biased state.

12. An apparatus according to claim 10, wherein the controlling unit is connected to the node through a second bias controlling capacitor and controls an electric potential of the node through the second bias controlling capacitor.

13. An imaging system comprising:
the photoelectric conversion apparatus according to claim 10; and
a signal processing apparatus for processing an imaging signal which is output from the photoelectric conversion apparatus.

14. A moving vehicle comprising:
an imaging apparatus having the photoelectric conversion apparatus according to claim 10;
a signal processing unit configured to process a signal based on signal charges generated in a first photoelectric conversion unit of the photoelectric conversion apparatus and a signal based on signal charges generated in a second photoelectric conversion unit an obtain information of a distance to an object; and
a main controlling unit configured to control the moving vehicle on the basis of the distance information.

15. A photoelectric conversion apparatus comprising a semiconductor substrate, a plurality of pixels, and a controlling unit, wherein:
each of the plurality of pixels has a photoelectric conversion unit and a diode;
the photoelectric conversion unit has:
a first electrode layer,
a second electrode layer provided between the first electrode layer and the semiconductor substrate, and
a photoelectric conversion layer provided between the first electrode layer and the second electrode layer,
wherein:
the diode has a first impurity diffused portion of a first conductivity type and a second impurity diffused portion of a second conductivity type, the first impurity diffused portion and the second impurity diffused portion being configured to form a PN junction, the first impurity diffused portion being formed in the second impurity diffused portion;
the second electrode layer is connected to the first impurity diffused portion,
the controlling unit applies a voltage adapted to set the diode into a forwardly biased state and a voltage adapted to set the diode into a reversely biased state, to the diode, respectively, to the second impurity diffused portion, and
the diode in the Zener breakdown, resets charges accumulated in the second electrode layer.

16. An apparatus according to claim 15, wherein the controlling unit allows the diode to cause the Zener breakdown and, thereafter, sets the diode into the forwardly biased state.

17. An imaging system comprising:
the photoelectric conversion apparatus according to claim 15; and
a signal processing apparatus for processing an imaging signal which is output from the photoelectric conversion apparatus.

18. A moving vehicle comprising:
an imaging apparatus having the photoelectric conversion apparatus according to claim 15;
a signal processing unit configured to process a signal based on signal charges generated in a first photoelectric conversion unit of the photoelectric conversion apparatus and a signal based on signal charges generated in a second photoelectric conversion unit and obtain information of a distance to an object; and
a main controlling unit configured to control the moving vehicle on the basis of the distance information.

19. A photoelectric conversion apparatus comprising a semiconductor substrate, a plurality of pixels, and a controlling unit, wherein:
each of the plurality of pixels has a photoelectric conversion unit and a diode;
the photoelectric conversion unit has:
a first electrode layer,
a second electrode layer provided between the first electrode layer and the semiconductor substrate, and
a photoelectric conversion layer provided between the first electrode layer and the second electrode layer,
wherein:
the diode has a first impurity diffused portion of a first conductivity type and a second impurity diffused portion of a second conductivity type;
the second electrode layer is connected to the first impurity diffused portion;
the controlling unit applies a voltage adapted to set the diode into a forwardly biased state and a voltage adapted to set the diode into a reversely biased state, to the diode, respectively,
the diode has a PN junction portion formed by the first impurity diffused portion and the second impurity diffused portion,
the second impurity diffused portion is a well region formed on the semiconductor substrate,
the first impurity diffused portion is formed in the well region, and
wherein the pixel further comprises a first amplification unit configured to amplify a signal based on signal charges accumulated in the second electrode layer, and wherein the pixel further comprises a second amplification unit connected to a post stage of the first amplification unit through a clamping capacitor and a node and a second diode connected to the node; and the controlling unit controls a voltage across terminals of the second diode and supplies a clamping voltage to the node.

20. An imaging system comprising:

the photoelectric conversion apparatus according to claim 19; and a signal processing apparatus for processing an imaging signal which is output from the photoelectric conversion apparatus.

21. A moving vehicle comprising:

an imaging apparatus having the photoelectric conversion apparatus according to claim 19;

a signal processing unit configured to process a signal based on signal charges generated in a first photoelectric conversion unit of the photoelectric conversion apparatus and a signal based on signal charges generated in a second photoelectric conversion unit and obtain information of a distance to an object; and a main controlling unit configured to control the moving vehicle on the basis of the distance information.

* * * * *